United States Patent
Arakawa et al.

(10) Patent No.: US 9,537,398 B2
(45) Date of Patent: Jan. 3, 2017

(54) VOLTAGE GENERATING CIRCUIT AND REGULATOR CIRCUIT FOR PRECISELY CONTROL PREDETERMINED HIGH VOLTAGE

(71) Applicant: Powerchip Technology Corporation, Hsinchu (TW)

(72) Inventors: Hideki Arakawa, Tokyo (JP); Tomofumi Kitani, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/798,477

(22) Filed: Jul. 14, 2015

(65) Prior Publication Data

US 2016/0233770 A1    Aug. 11, 2016

(30) Foreign Application Priority Data

Feb. 9, 2015    (JP) ................................. 2015-023422

(51) Int. Cl.
| | |
|---|---|
| G11C 16/06 | (2006.01) |
| H02M 3/158 | (2006.01) |
| G11C 16/30 | (2006.01) |
| G11C 5/14 | (2006.01) |
| H02M 3/07 | (2006.01) |

(52) U.S. Cl.
CPC ............ H02M 3/158 (2013.01); G11C 5/145 (2013.01); G11C 16/30 (2013.01); *H02M 3/07* (2013.01)

(58) Field of Classification Search
CPC .......... H02M 3/158; H02M 3/07; G11C 16/30
USPC ............... 365/189.09, 203, 204, 207, 210.12, 226,365/185.18
See application file for complete search history.

(56) References Cited

U.S. PATENT DOCUMENTS

| | | | |
|---|---|---|---|
| 2008/0197887 A1* | 8/2008 | Uchida | H03F 3/45475 327/72 |
| 2009/0039840 A1* | 2/2009 | Lee | G11C 5/145 323/266 |
| 2012/0074923 A1 | 3/2012 | Tran et al. | |
| 2012/0126906 A1* | 5/2012 | Choe | H03L 1/02 331/143 |

FOREIGN PATENT DOCUMENTS

| | | |
|---|---|---|
| JP | 2003-169466 | 6/2003 |
| JP | 2006-187187 | 7/2006 |
| JP | 2008178079 | 7/2008 |

* cited by examiner

*Primary Examiner* — Tha-O H Bui
(74) *Attorney, Agent, or Firm* — Jianq Chyun IP Office

(57) ABSTRACT

A high voltage generating circuit includes a charge pump circuit and an output voltage control circuit. The charge pump circuit raises a voltage to a high voltage higher than a power supply voltage. The output voltage control circuit controls the voltage to make the raised high voltage to be a predetermined target voltage. The output voltage control circuit includes at least two offset free comparator circuits, or at least one offset free comparator circuit and at least one differential amplifier. The offset free comparator circuit includes a coupling capacitor, a differential amplifier and a plural switch. The coupling capacitor inputs a voltage corresponding to the high voltage. The differential amplifier compares a voltage from the coupling capacitor with a predetermined reference voltage and outputs a comparison result voltage to the charge pump circuit. The switches are connected to the differential amplifier to cancel an offset of the differential amplifier.

9 Claims, 14 Drawing Sheets

VOLTAGE GENERATING CIRCUIT AND REGULATOR CIRCUIT FOR PRECISELY CONTROL PREDETERMINED HIGH VOLTAGE

CROSS-REFERENCE TO RELATED APPLICATION

This application claims the priority benefit of Japan application serial no. 2015-023422, filed on Feb. 9, 2015. The entirety of the above-mentioned patent application is hereby incorporated by reference herein and made a part of this specification.

BACKGROUND OF THE INVENTION

Field of the Invention

The invention relates to a voltage generating circuit and a regulator circuit applied to a semiconductor storage device such as a flash memory, etc., and a semiconductor storage device and a semiconductor device including the above voltage generating circuit and the regulator circuit.

Description of Related Art

FIG. 1 is a block diagram of a conventional non-volatile storage device serving as a flash memory.

In FIG. 1, the non-volatile memory apparatus includes:

(1) a memory cell array 20, serving as a flash memory array and used for storing data;

(2) a page buffer 21, writing data come from an input/output buffer 31 into the memory cell array 20 with a page unit, or reading data from the memory cell array 20 with the page unit, and outputting the same to the input/output buffer 31;

(3) a row decoder 22, configured to specify a block and a word line of the memory cell array 20 corresponding to a specified address;

(4) a status register 23, temporarily storing a state of the non-volatile storage device according to a signal come from a control logic 35, and outputting the same to the input/output buffer 31, and generating a read/busy signal (R/B signal) for outputting to an R/B signal terminal 42;

(5) the input/output buffer 31, temporarily storing data input and output through an input/output terminal 41;

(6) a command decoder 32, decoding a command come from the input/output buffer 31, and outputting decoded command data to the control logic 35;

(7) an address buffer 33, temporarily storing the specified address come from the input/output buffer 31;

(8) a power-on reset circuit 36, outputting a reset signal according to an external power voltage VCC, where the reset signal is configured to reset the operation of the semiconductor chip in case of power-on;

(9) a reference voltage generating circuit 10, generating a reference voltage VDDREF for an internal power voltage and a predetermined reference voltage VREF based on the external power voltage VCC exerted by an external power voltage terminal 44;

(10) an internal power voltage generating circuit 11, generating an internal power voltage VDD based on the reference voltage VDDREF, and supplying the same to each of the circuits;

(11) a high voltage and middle voltage generating and control circuit 12, generating and outputting a high voltage (HV) and a middle voltage (MV) required for data writing (programming) and data erasing based on the reference voltage VREF; and

(12) the control logic 35, performing predetermined control to various circuits (including the reference voltage generating circuit 10, the internal power voltage generating circuit 11 and the high voltage and middle voltage generating and control circuit 12, the page buffer 21, the status register 23) in the non-volatile memory device according to the command data come from the command decoder 32, a control signal input through a control signal terminal 43, or the reset signal come from the power-on reset circuit 36.

As shown in FIG. 1, in the non-volatile memory device such as a flash memory, etc., the high voltage (HV) is required to be generated.

FIG. 2 is a circuit diagram of a conventional high voltage generating circuit. FIG. 3 is a diagram showing an operation of the high voltage generating circuit of FIG. 2 and a relationship between a high voltage Vhv and time.

For example, in the non-volatile memory device of FIG. 1 such as a NAND flash memory, etc. that applies a Fowler-Nordheim tunneling phenomenon, in order to generate a predetermined high voltage (HV) higher than a power voltage Vdd to facilitate performing data programming (data writing) and data erasing, a charge pump circuit 102 is used. In FIG. 2, the high voltage generating circuit includes an AND gate 101, the charge pump circuit 102, voltage dividing resistors R0, R1 configured to divide the high voltage Vhv serving as an output voltage into a divided voltage Vdiv, and a differential amplifier 103 configured to compare the divided voltage Vdiv with a reference voltage Vref. As shown in FIG. 3, corresponding to an offset voltage value of the differential amplifier 103, an enable signal EN output by the differential amplifier 103 is varied and deviated the trip point from the reference voltage Vref.

PRIOR TECHNICAL LITERATURES

Patent Literatures

[Patent literature 1] Japan Patent Publication No. 2008-178079

The high voltage generating circuit of FIG. 2 has following problems.

In FIG. 2, the problems are as follows. The comparator includes a differential amplifier or an operational amplifier, the offset voltage induces an error relative to a trip point of the input voltage from Vin=Vref to Vin=Vref±Voffset, such that the high voltage Vhv deviates from the predetermined target voltage Vtarget. It is assumed that when the offset voltage Voffset=36 mV (3 times of a standard deviation), the high voltage Vhv deviates from the target voltage Vtarget by about 3% (where the reference voltage Vref=1.2V). In case of the above deviation of 3%, when an incremental step pulse program method is used, data read disturb is increased, such that a readout error is increased. Now, by a step voltage Vstep=103%, in case that a distribution width of a threshold voltage by the programming operation exceeds 106%, and a voltage Vpass is deviated from 6V to 6.18V during the data reading operation, a large read disturb is produced. Moreover, when a readout voltage is deviated from 1.3V by −3% to reduce 0.04V, in case that each step is 0.025V, the voltage decrease requires trimming processing of one step or two steps.

FIG. 4A is a circuit diagram of an offset free comparator circuit disclosed in the patent literature 1. FIG. 4B is a timing chart of the operation of the offset free comparator circuit of FIG. 4A.

The comparator of FIG. 4A includes a switch 124, a switch 125, an input capacitor 120 for sample and hold, a first amplifier 121 serving as an amplification circuit with an amplifier gain a, a second amplifier 122 serving as a second amplification circuit with an amplifier gain A, and a latch circuit 123. The switch 124 is connected between an input terminal VIN of the comparator circuit and one terminal of the input capacitor 120. The switch 125 is connected between the ground and one terminal of the input capacitor 120. Another terminal of the input capacitor 120 is connected to an inverting input terminal of the first amplifier 121. A non-inverting input terminal of the first amplifier 121 is coupled to the ground. An output terminal of the first amplifier 121 is coupled to an output terminal OUT of the comparator circuit through the latch circuit 123. Moreover, the output terminal of the first amplifier 121 is connected to an input terminal of the second amplifier 122. An output terminal of the second amplifier 122 is connected to the inverting input terminal of the first amplifier 121 through a switch 126.

The amplifier gain a (for example, 10-fold) of the first amplifier 121 is set to be lower than the amplifier gain A (for example, 100-fold) of the second amplifier 122. Moreover, under a sampling state, the first amplifier 121 and the second amplifier 122 are used, and under a holding and comparing state, only the first amplifier 121 is used.

The switch 124 and the switch 126 are turned on or turned off in response to a clock signal φ1 shown in FIG. 4B. The switch 125 is turned on or turned off in response to a clock signal φ2 shown in FIG. 4B. The latch circuit 123 amplifies and latches a voltage at the output terminal of the first amplifier 121 according to the clock signal φ2. As shown in FIG. 4B, a phase of the clock signal φ1 and a phase of the clock signal φ2 are complementary. Moreover, there is a duration that both of the clock signal φ1 and the clock signal φ2 are in a low level. Therefore, in such duration, all of the switches 124, 125 and 126 are simultaneously turned off.

As described above, the offset free comparator circuit using the input capacitor used for coupling the input signal and a feedback loop used for feeding back an output of the comparator to the input side is well known by those skilled in the art in the technical field of the A/D converter of the patent literature 1.

FIG. 5A is a circuit diagram of a first operation mode of the high voltage generating circuit of FIG. 2 applying the conventional offset free comparator circuit. FIG. 5B is a circuit diagram of a second operation mode of the high voltage generating circuit of FIG. 5A. Moreover, FIG. 5C is a diagram showing an operation of the high voltage generating circuit of FIG. 5A and FIG. 5B and a relationship between a divided voltage Vdiv and time. In FIG. 5A and FIG. 5B, the high voltage generating circuit includes a NOR gate 101A, a charge pump circuit 102, a differential amplifier 103, a latch circuit L1, a switch S1, a switch S2, a switch S3 and an input capacitor Cs. Moreover, in FIG. 5A and FIG. 5B, Sclk is, for example, a system clock of about 100 kHz, Pclk is, for example, a charge pump clock of about 20 MHz. In addition, an enable signal EN and an inverted enable signal ENB are respectively generated at two ends of the latch circuit L1.

In FIG. 5A and FIG. 5B, cancellation of the offset effect is described. First, as shown in FIG. 5A, when the switch S2 is turned on, the switch S1 is turned off and the switch S3 is connected to the reference voltage Vref, a voltage at the inverting input terminal of the differential amplifier 103 is Vm=Vref+Voffset. Moreover, in FIG. 5B, when the switch S1 is turned on, the switch S2 is turned off and the switch S3 is connected to the divided voltage Vdiv, the differential amplifier 103 including a feedback loop is controlled to be Vdiv=Vref.

However, such type of the comparator circuit is not used for controlling the charge pump circuit, and a reason thereof is that during a period that each of the switches S1 to S3 is switched to an offset cancellation position to cancel the offset, the comparator circuit cannot control the charge pump circuit.

FIG. 5D is a diagram illustrating operation examples of the high voltage generating circuit of FIG. 5A and FIG. 5B under various states and a relationship between the high voltage Vhv and time.

During the operation period of FIG. 5A, since the switch S1 is turned off, the comparator circuit cannot feed back the divided voltage Vdiv, and the charge pump circuit 102 is controlled according to a latch state not reflecting the divided voltage Vdiv. Therefore, following problems are encountered: when the latch circuit L1 is latched to a high level, the high voltage Vhv is increased, and on the other hand, and when the latch circuit L1 is latched to a low level, the high voltage Vhv is decreased, and additionally when a devices state is changed and a load current is drastically increased, the high voltage Vhv is probably drastically decreased.

SUMMARY OF THE INVENTION

The invention is directed to a voltage generating circuit capable of stably and precisely controlling a predetermined high voltage compared with that the conventional technique, a regulator and a semiconductor memory device including the aforementioned voltage generating circuit and the aforementioned regulator circuit, and a semiconductor device including the aforementioned voltage generating circuit and the aforementioned regulator circuit.

The voltage generating circuit of the invention is a high voltage generating circuit including a charge pump circuit and an output voltage control circuit, the charge pump circuit raises a voltage to a high voltage higher than a power voltage, the output voltage control circuit controls the voltage to make the raised high voltage to be a predetermined target voltage, the voltage generating circuit is characterized in that:

the output voltage control circuit includes at least two offset free comparator circuits or at least one offset free comparator circuit and at least one differential amplifier, wherein the offset free comparator circuit includes:

a coupling capacitor, inputting a voltage corresponding to the high voltage;

a differential amplifier, comparing a voltage from the coupling capacitor with a predetermined reference voltage, and outputting a comparison result voltage to the charge pump circuit; and a plurality of switches, respectively connected to the differential amplifier to cancel an offset of the differential amplifier.

In an embodiment of the invention, the output voltage control circuit includes two offset free comparator circuits, the two offset free comparator circuits use at least one clock, and an offset cancellation period and a comparator operation period alternately function.

In an embodiment of the invention, the output voltage control circuit includes at least two offset free comparator circuits, the at least two offset free comparator circuits use at least two clocks, and offset cancellation periods are not overlapped to each other, and in each of the offset free comparator circuits, the offset cancellation period and a comparator operation period alternately function.

In an embodiment of the invention, the output voltage control circuit includes one offset free comparator circuit and one differential amplifier, the offset free comparator circuit use at least one clock, and an offset cancellation period and a comparator operation period alternately function.

In an embodiment of the invention, the output voltage control circuit includes at least two offset free comparator circuits and at least one differential amplifier, the at least two offset free comparator circuits use at least two clocks, and offset cancellation periods are not overlapped to each other, and in each of the offset free comparator circuits, the offset cancellation period and a comparator operation period alternately function.

In an embodiment of the invention, the voltage generating circuit further includes a voltage dividing circuit, the voltage dividing circuit divides the high voltage into a corresponding divided voltage, and outputs the divided voltage to the output voltage control circuit.

In an embodiment of the invention, the voltage dividing circuit divides the high voltage into a first divided voltage and a second divided voltage, wherein the second divided voltage is lower than the first divided voltage, and the voltage dividing circuit outputs the first divided voltage to the differential amplifier, and outputs the second divided voltage to the offset free comparator circuit.

In an embodiment of the invention, the voltage dividing circuit outputs the divided voltage to the offset free comparator circuit and the differential amplifier, and the reference voltage input to the offset free comparator circuit is higher than the reference voltage input to the differential amplifier.

The invention provides a regulator circuit, including:

a buck circuit, decreasing an input voltage to a output voltage; and an output voltage control circuit, controlling the output voltage to be a predetermined target voltage, and the regulator circuit is characterized in that:

the output voltage control circuit includes at least two offset free comparator circuits, wherein each of the offset free comparator circuits includes:

a coupling capacitor, inputting a voltage corresponding to the output voltage;

a differential amplifier, comparing a voltage from the coupling capacitor with a predetermined reference voltage, and outputting a comparison result voltage to the buck circuit; and a plurality of switches, respectively connected to the differential amplifier to cancel an offset of the differential amplifier.

In an embodiment of the invention, the regulator circuit further includes a voltage dividing circuit, the voltage dividing circuit divides the output voltage into a corresponding divided voltage, and outputs the divided voltage to the output voltage control circuit.

In an embodiment of the invention, the two offset free comparator circuits use at least one clock, and an offset cancellation period and a comparator operation period alternately function.

In an embodiment of the invention, the at least two offset free comparator circuits use at least two clocks, and the offset cancellation periods are not overlapped to each other, and in each of the offset free comparator circuits, an offset cancellation period and a comparator operation period alternately function.

In an embodiment of the invention, the buck circuit includes a first MOS transistor, the first MOS transistor is an N-channel MOS transistor or a P-channel MOS transistor.

In an embodiment of the invention, the regulator circuit further includes at least one level shifter, the at least one level shifter performs voltage conversion to the comparison result voltage, and exerts a voltage-converted voltage to a gate of the first MOS transistor.

In an embodiment of the invention, the regulator circuit further includes at least two second MOS transistors, respectively connected to the first MOS transistor in series between the input voltage and the output voltage, wherein the at least two second MOS transistors are connected to each other in parallel; and a plurality of level shifters, performing voltage conversion to each of the comparison result voltages come from the at least two offset free comparator circuits, and respectively exerting each voltage-converted voltage to gates of the at least two second MOS transistors.

The invention provides a semiconductor storage device including the aforementioned voltage generating circuit.

The invention provides a semiconductor device including the aforementioned voltage generating circuit.

The invention provides a semiconductor storage device including the aforementioned regulator circuit.

The invention provides a semiconductor device including the aforementioned regulator circuit.

The voltage generating circuit and the regulator circuit of the invention are able to stably operate compared with the conventional technique, and are able to precisely control the predetermined high voltage.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
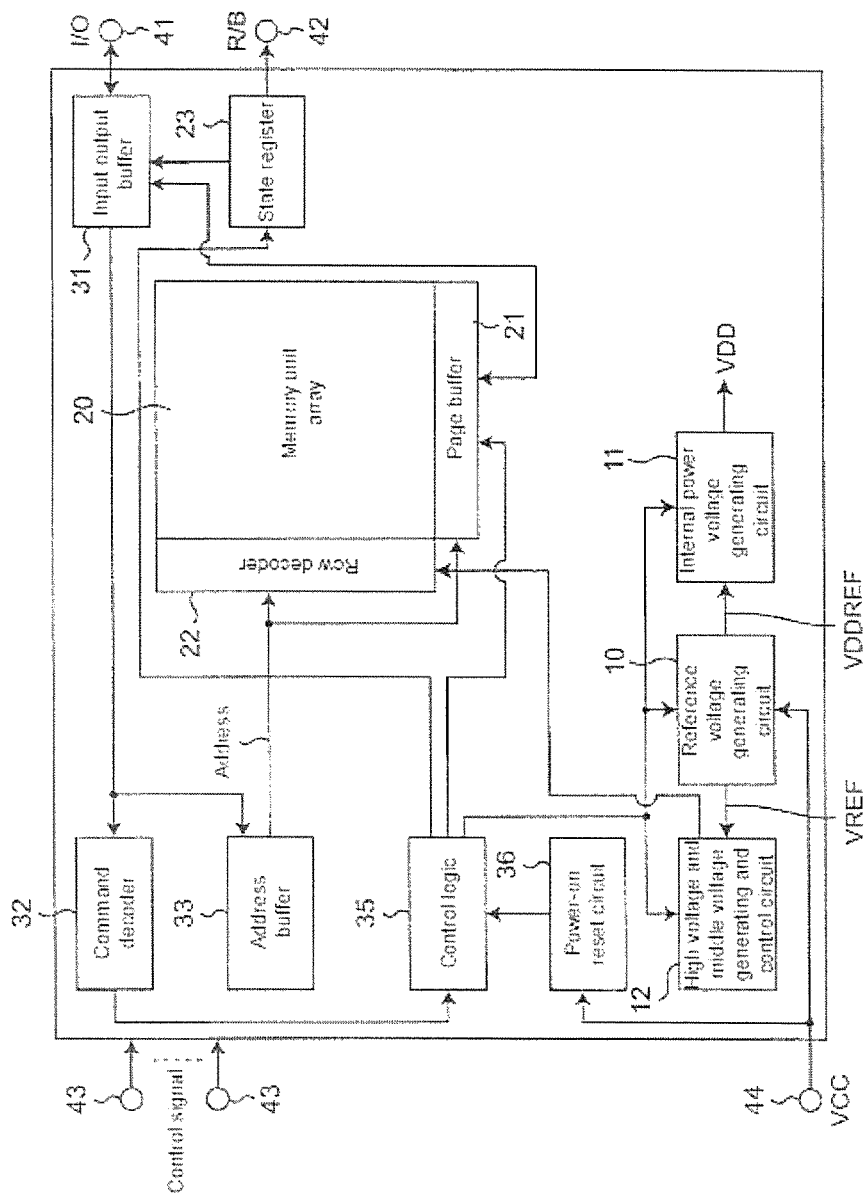
FIG. 1 is a block diagram of a conventional non-volatile memory device.
Figure 2:
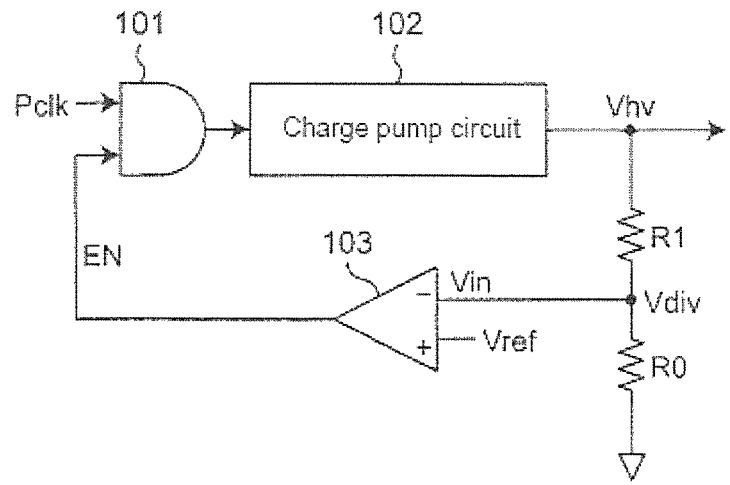
FIG. 2 is a circuit diagram of a conventional high voltage generating circuit.
Figure 3:
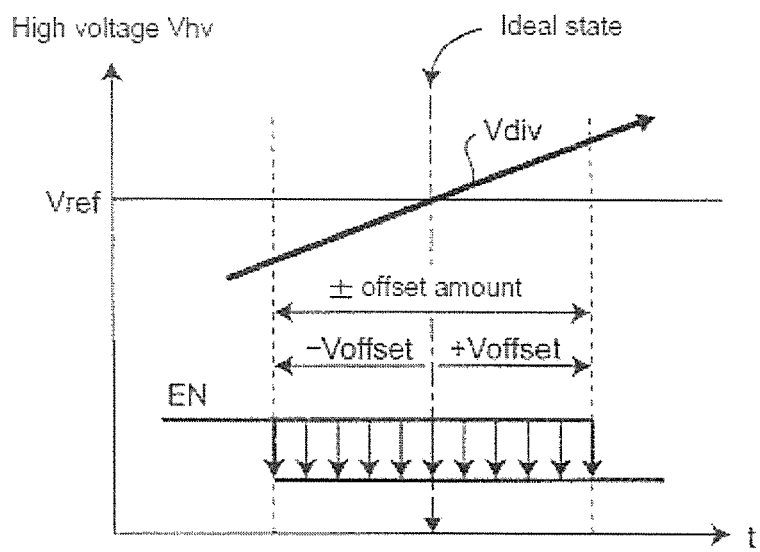
FIG. 3 is a diagram showing an operation of the high voltage generating circuit of FIG. 2 and a relationship between a high voltage Vhv and time.
Figure 4A:
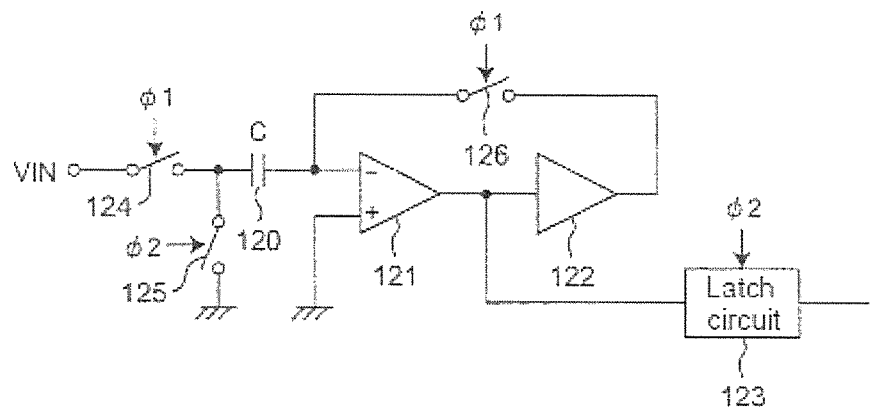
FIG. 4A is a circuit diagram of an offset free comparator circuit disclosed in the patent literature 1.
Figure 4B:
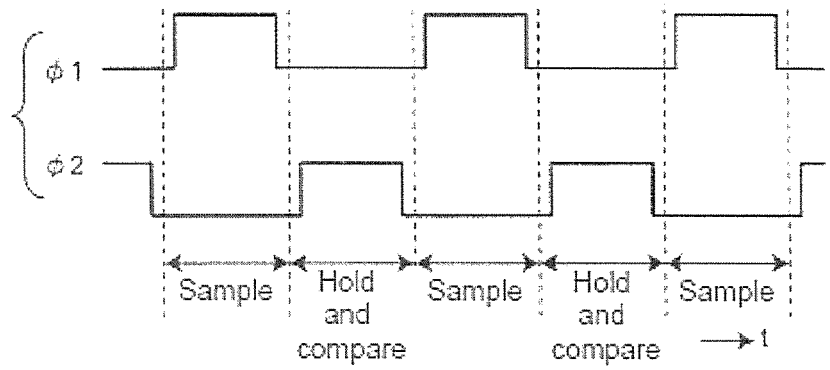
FIG. 4B is a timing chart of an operation of the offset free comparator circuit of FIG. 4A.
Figure 5A:
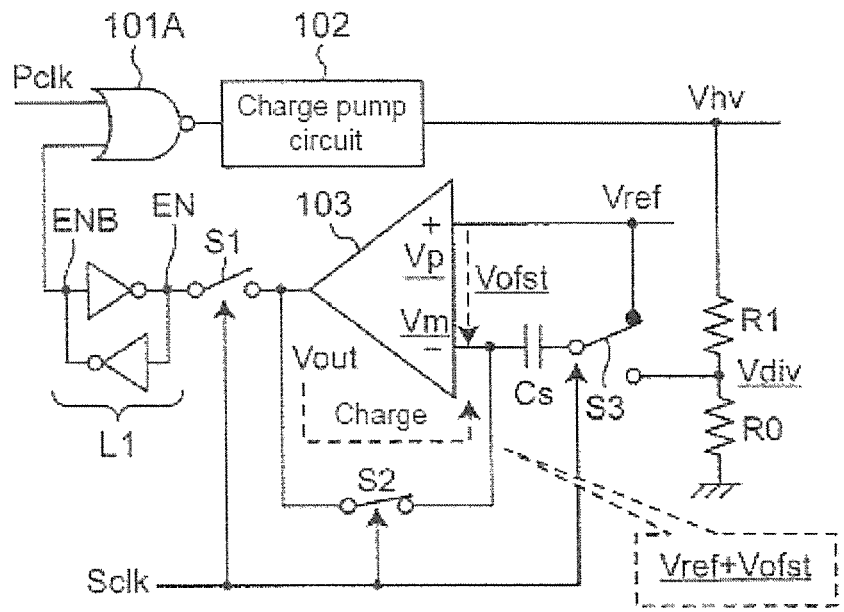
FIG. 5A is a circuit diagram of a first operation mode of a high voltage generating circuit.
Figure 5B:
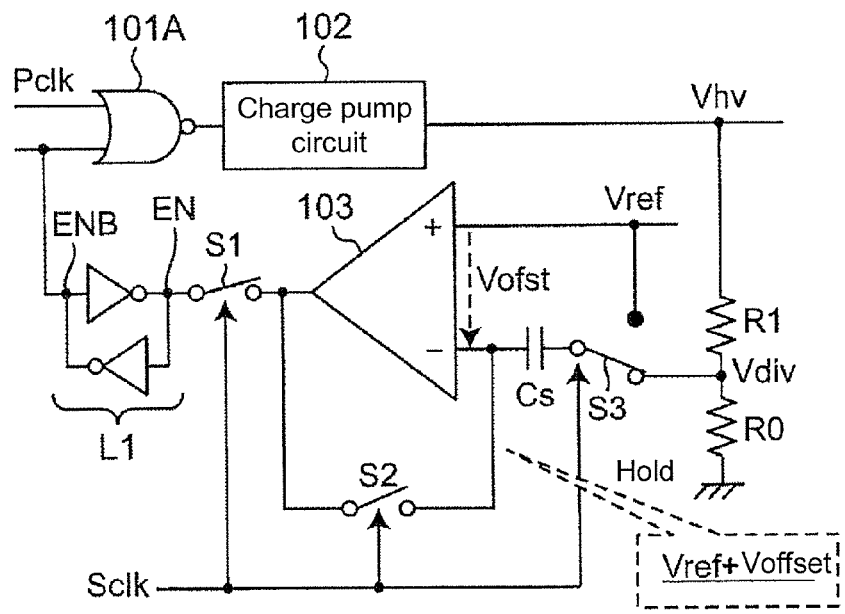
FIG. 5B is a circuit diagram of a second operation mode of the high voltage generating circuit of FIG. 5A.
Figure 5C:
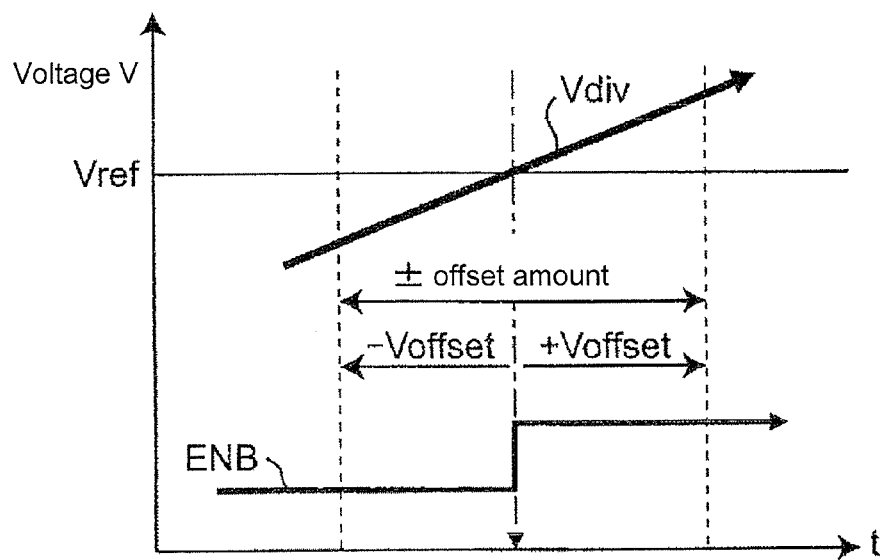
FIG. 5C is a diagram showing an operation of the high voltage generating circuit of FIG. 5A and FIG. 5B and a relationship between a divided voltage Vdiv and time.
Figure 5D:
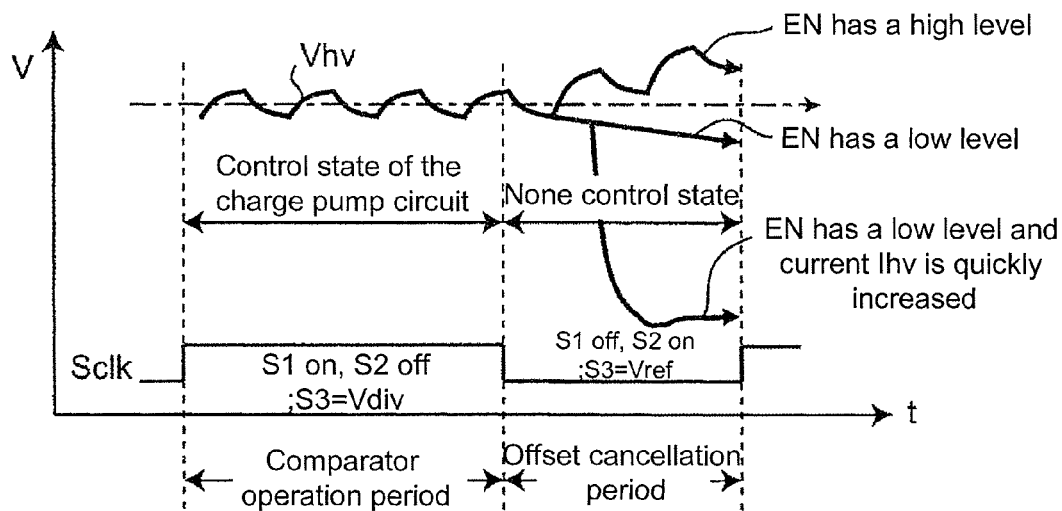
FIG. 5D is a diagram illustrating operation examples of the high voltage generating circuit of FIG. 5A and FIG. 5B and a relationship between the high voltage Vhv and time

Reference will now be made in detail to the present preferred embodiments of the invention, examples of which are illustrated in the accompanying drawings. Wherever possible, the same reference numbers are used in the drawings and the description to refer to the same or like parts.

Embodiment 1

Figure 6A:
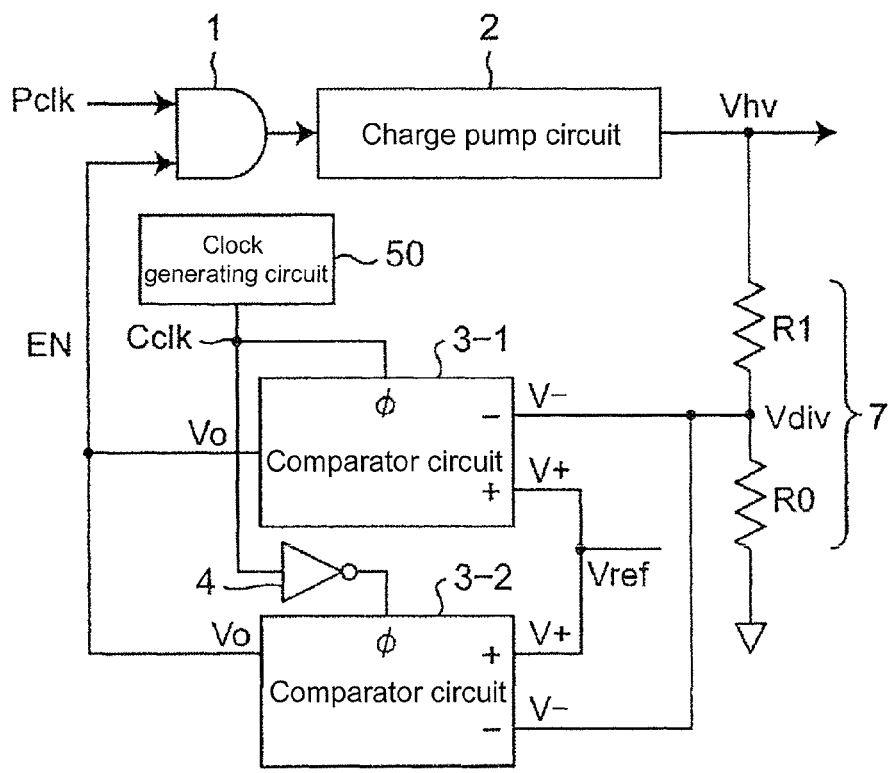
FIG. 6A is a circuit diagram of a high voltage generating circuit according to an embodiment 1 of the invention.
Figure 6B:
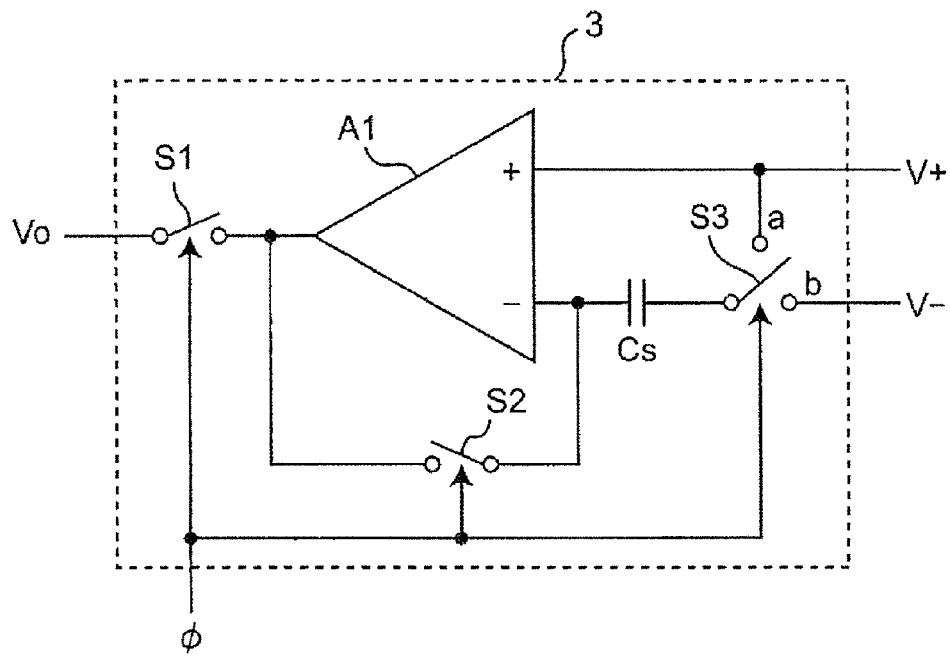
FIG. 6B is a circuit diagram of a comparator circuit 3 of FIG. 6A.

FIG. 6A is a circuit diagram of a high voltage generating circuit according to the embodiment 1 of the invention, FIG. 6B is a circuit diagram of a comparator circuit 3 of FIG. 6A. In FIG. 6A, the high voltage generating circuit includes an AND gate 1, a charge pump circuit 2, a voltage dividing circuit 7 including a voltage dividing resistor R0 and a resistor R1, a comparator circuit 3-1 and a comparator circuit 3-2 (referred to as a comparator circuit 3 in general), for example, implemented by offset free comparators and constructing an output voltage control circuit, an inverter 4 and a clock generating circuit 50. Although the clock generating circuit 50 is applied to the following embodiments, but it is not shown hereafter.

In FIG. 6A, the charge pump clock Pclk is input to a first input terminal of the AND gate 1, and an output voltage of each of the comparator circuit 3-1 and the comparator circuit 3-2 serves as an enable signal EN and is input to a second input terminal of the AND gate 1. An output voltage of the AND gate 1 is input to the charge pump circuit 2, and the charge pump circuit 2 raises a power supply voltage to a high voltage Vhv higher than the power supply voltage Vdd, and outputs the same. The voltage dividing resistor R0 and the voltage dividing resistor R1 are connected in series through one ends, the other end of the voltage dividing resistor R0 is connected to the ground, and the other end of the voltage dividing resistor R1 is connected to an output terminal of the charge pump circuit 2.

After the high voltage Vhv is divided by the voltage dividing resistor R0 and the voltage dividing resistor R1, the divided voltage Vdiv corresponding to the high voltage Vhv is input to an inverting input terminal of each of the comparator circuit 3-1 and the comparator circuit 3-2. Moreover, the predetermined reference voltage Vref is input to a non-inverting input terminal of each of the comparator circuit 3-1 and the comparator circuit 3-2. The comparator circuit 3-1 operates according to a clock Cclk come from the clock generating circuit 50, and compares a voltage input to the inverting input terminal thereof and a voltage input to the non-inverting input terminal thereof, and outputs an output voltage Vo serving as a comparison result signal, where the output voltage Vo is taken as the enable signal EN and input to the second input terminal of the AND gate 1. Moreover, the clock Cclk come from the clock generating circuit 50 is inverted by an inverter 4, and it is input to a clock terminal of the comparator circuit 3-2. The comparator circuit 3-2 operates according to the inverted clock Cclk, and compares a voltage input to the inverting input terminal thereof and a voltage input to the non-inverting input terminal thereof, and outputs an output voltage Vo serving as a comparison result signal, where the output voltage Vo is taken as the enable signal EN and input to the second input terminal of the AND gate 1.

In FIG. 6B, the comparator circuit 3 includes a differential amplifier A2, for example, an operational amplifier operating under the predetermined power voltage Vdd, switches S1 to S3, and an input coupling capacitor (which is referred to as input capacitor) Cs for capacitive coupling of an input signal. In FIG. 6B, the voltage input V+ to the non-inverting input terminal of the comparator circuit 3 is input to a non-inverting input terminal of the differential amplifier A1, and is connected to a contact a of the switch S3. Moreover, the voltage input V− to the inverting input terminal of the comparator circuit 3 is input to an inverting input terminal of the differential amplifier A1 through a contact b of the switch S3, a common terminal of the switch S3 and the input capacitor Cs. An output voltage output by the differential amplifier A1 is fed back to the inverting input terminal through the switch S2, and is output as the output voltage Vo of the comparator circuit 3 through the switch S1. Moreover, the switches S1 to S3 are turned on or turned off according to a clock input to the clock terminals (φ) as following.

(A) when a comparator operation period=a control period of the charge pump circuit 2, the switch S1 is turned on, the switch S2 is turned off, and the switch S3 is switched to the contact b (the voltage dividing voltage Vdiv).

(B) when an offset cancellation period=a non-control period of the charge pump circuit 2, the switch S1 is turned off, the switch S2 is turned on, and the switch S3 is switched to the contact a (the reference voltage Vref).

In the present embodiment, two comparator circuit 3-1 and comparator circuit 3-2 are included, and the two comparator circuit 3-1 and comparator circuit 3-2 are operated alternately. When one of the two comparator circuit 3-1 and comparator circuit 3-2 is in the offset cancellation period, the other one is in a comparator operation period, and the charge pump circuit 2 is seamlessly (continuously) controlled. Therefore, the problem that the high voltage Vhv is increased or decreased during the non-control period of the charge pump is resolved. In this way, since the two comparator circuit 3-1 and comparator circuit 3-2 cannot be completely the same, when the divided voltage Vdiv is very close to the reference voltage Vref, a problem that one output is high and another output is low is occurred, though such problem can be resolved within an operation period of one clock.

As described above, in the present embodiment, two comparator circuit 3-1 and comparator circuit 3-2 are included, and the two comparator circuit 3-1 and comparator circuit 3-2 are operated in alternation to make the charge pump circuit 2 to operate. Therefore, the problem that the high voltage Vhv is increased or decreased during the non-control period of the charge pump is resolved. Therefore, compared with the conventional technique, the voltage generating circuit can be stably operated, and the offset voltage of the differential amplifier can be compensated, and the predetermined high voltage is precisely controlled.

Moreover, in the present embodiment, a single-phase clock Cclk is used, though the invention is not limited thereto, and two two-phase clocks with non-overlap complementary clocks can also be used. Moreover, individual clocks can be allocated to the switch S1, the switch S2 and the switch S3.

Embodiment 2

Figure 7A:
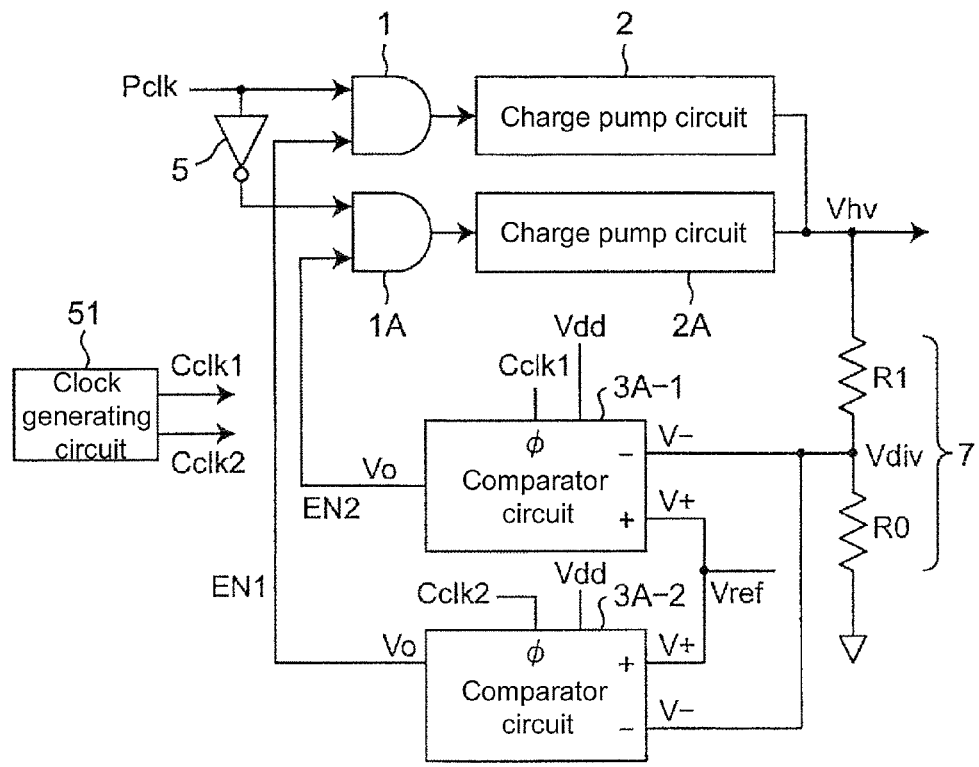
FIG. 7A is a circuit diagram of a high voltage generating circuit according to an embodiment 2 of the invention.
Figure 7B:
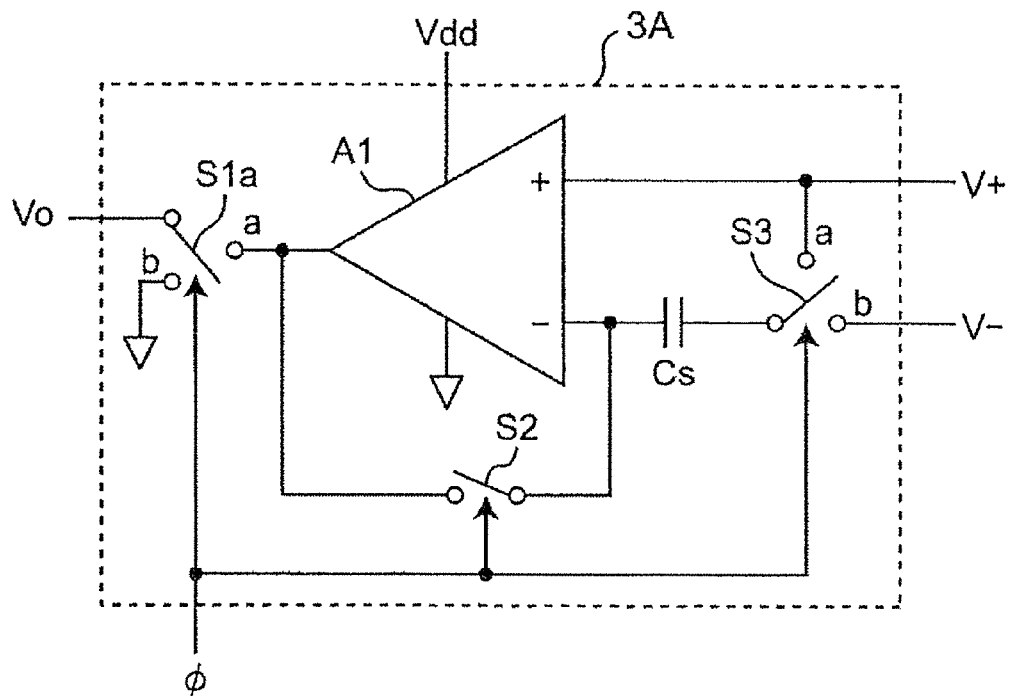
FIG. 7B is a circuit diagram of a comparator circuit 3A of FIG. 7A.
Figure 7C:
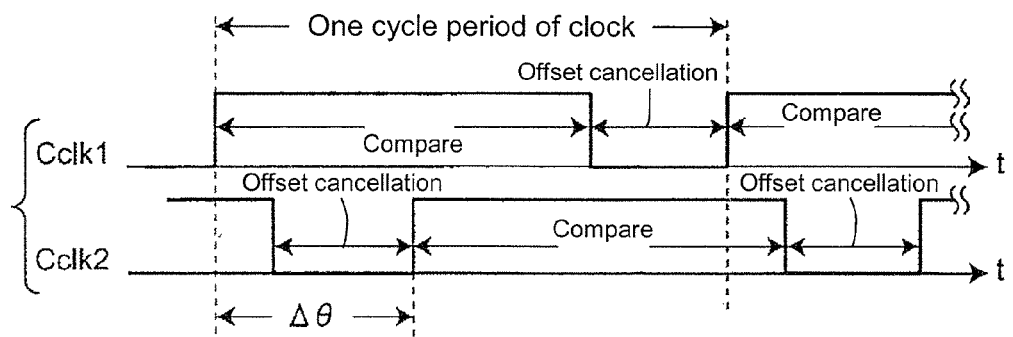
FIG. 7C is a timing diagram of a clock Cclk1 and a clock Cclk2 generated by a clock generating circuit 51 of FIG. 7A.

FIG. 7A is a circuit diagram of a high voltage generating circuit according to the embodiment 2 of the invention, FIG. 7B is a circuit diagram of a comparator circuit 3A of FIG. 7A. Moreover, FIG. 7C is a timing diagram of a clock Cclk1 and a clock Cclk2 generated by a clock generating circuit 51 of FIG. 7A.

As shown in FIG. 7A, compared to the high voltage generating circuit of the embodiment 1 of FIG. 6A, the high voltage generating circuit of the embodiment 2 has following differences:

(1) further includes a charge pump circuit 2A and an AND gate 1A.

(2) further includes an inverter 5 due to usage of the AND gate 1A.

(3) includes a comparator circuit 3A-1 and a comparator circuit 3A-2 (referred to as a comparator circuit 3A in general) to replace the comparator circuit 3-1 and the comparator circuit 3-2.

(4) includes a clock generating circuit 51 to replace the clock generating circuit 50. Although the clock generating circuit 51 applied to the following embodiments, it is not shown hereafter.

The above differences are described in detail below.

In FIG. 7A, the clock generating circuit 51 generates the clock Cclk1 and the clock Cclk2 in a manner that the comparator operation period is longer than the offset cancellation period and the offset cancellation periods of the comparator circuit 3A-1 and the comparator circuit 3A-2 are not overlapped as that shown in FIG. 7C. In this way, a phase difference $\Delta\theta$ between the clock Cclk1 and the clock Cclk2 is within a range of $0<\Delta\theta<180$ degrees.

The clock Pclk is input to the first input terminal of the AND gate 1, and is input to a first input terminal of the AND gate 1A through the inverter 5. Similar to the charge pump circuit 2, the charge pump circuit 2A raises the power voltage to the predetermined high voltage Vhv for outputting. Moreover, the output terminals of the charge pump circuit 2 and the charge pump circuit 2A are connected to each other. Connections of the input terminals of the comparator circuit 3A-1 and the comparator circuit 3A-2 are the same as that of the embodiment 1, though the comparator circuit 3A-1 is synchronous to the clock Cclk1 and takes the output voltage Vo of the comparison result as an enable signal EN2 for outputting to a second input terminal of the AND gate 1A. And, the comparator circuit 3A-2 is synchronous to the clock Cclk2 and takes the output voltage Vo of the comparison result as an enable signal EN1 for outputting to the second input terminal of the AND gate 1.

In FIG. 7B, compared to the comparator circuit 3 of FIG. 6A, the comparator circuit 3A has a following difference. The comparator circuit 3A includes a switch S1a to replace the switch S1. The output voltage of the differential amplifier A1 is input to a contact a of the switch S1a, a contact b of the switch S1a is connected to the ground, and the output voltage Vo is output through a common terminal of the switch S1a. The switch S1a is switched to the side of the contact b during the offset cancellation period, and is switched to the side of the contact a during the comparator operation period.

In the high voltage generating circuit as that described above, two charge pump circuits 2 and 2A are configured, and two clocks Cclk1 and Cclk2 are generated for the comparator circuit 3A-1 and the comparator circuit 3A-2. The comparator operation period of each of the clocks Cclk1 and Cclk2 is set to be longer than the offset cancellation period thereof, and the clock Cclk2 is generated by shifting the clock Cclk1 by a predetermined phase difference $\Delta\theta$. The aforementioned high voltage generating circuit has the same effects with that of the high voltage generating circuit of the embodiment 1, and has following effects. As shown in FIG. 7C, a ratio Top between operation time of the charge pump circuit 2 and the charge pump circuit 2A can be represented as follows.

$$\text{Top=comparator operation period/one cycle period of the clock} \quad (1)$$

Therefore, performances of the charge pump circuit 2 and the charge pump circuit 2A are not significantly reduced. Moreover, by taking the ratio Top into account for that the charge pump circuits 2 and 2A are respectively set to have ½ size of the charge pump circuit 2 of the embodiment 1, such that a current driving capability thereof is the same with that of the embodiment 1, and the high voltage Vhv with a smaller ripple can be output.

Moreover, by configuring a plurality of (more than 2) comparator circuits having respectively the slightly shifted offset cancellation period and the corresponding clocks and the charge pump circuits and connecting the same in parallel, the ripple of the output high voltage can be further decreased, and the high voltage generating circuit with improved current driving capability is implemented.

Embodiment 3

Figure 8:
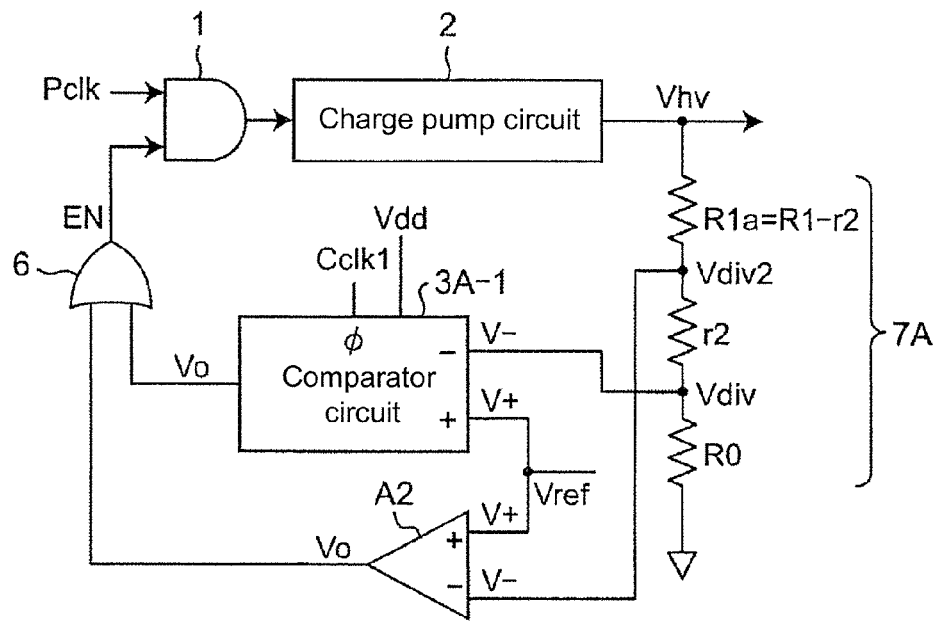
FIG. 8 is a circuit diagram of a high voltage generating circuit according to the embodiment 3 of the invention.

FIG. 8 is a circuit diagram of a high voltage generating circuit according to the embodiment 3 of the invention. As shown in FIG. 8, compared to the high voltage generating circuit of the embodiment 1 of FIG. 6A, the high voltage generating circuit of the embodiment 3 has following differences:

(1) includes a comparator circuit 3A-1 of the embodiment 2 to replace the comparator circuit 3-1.

(2) includes a differential amplifier A2 serving as a general comparator without an offset free function to replace the comparator circuit 3-2. Moreover, the reference voltage Vref is input to a non-inverting input terminal of the differential amplifier A2.

(3) further includes an OR gate 6, where the OR gate 6 performs logic OR to the output voltage Vo come from the comparator circuit 3A-1 and the output voltage Vo come from the differential amplifier A2 to generate the enable signal EN and outputs the same to the second input terminal of the AND gate 1.

(4) includes a voltage dividing circuit 7A to replace the voltage dividing circuit 7, where the voltage dividing circuit 7A is composed of a resistor R0, a resistor r2, a resistor R1$a$ (=R1−r2) connected in series. In this way, the divided voltage Vdiv is generated at a connection point of the resistor R0 and the resistor r2, and a divided voltage Vdiv2 is generated at a connection point of the resistor R1$a$ and the resistor r2, and is input to an inverting input terminal of the differential amplifier A2.

In the present embodiment, one offset free comparator circuit 3A-1 and the differential amplifier A2 are included, where the differential amplifier A2 is a general comparator without the offset free function. The differential amplifier A2 is used for restoring decrease of the high voltage Vhv during a raising period of the high voltage Vhv, and during the offset cancellation period of the offset free comparator circuit 3A-1. On the other hand, the offset free comparator circuit 3A-1 is used for a high precision regulation of the high voltage Vhv when the high voltage Vhv is in a stable state. Therefore, in the differential amplifier A2, the divided voltage Vdiv2 slightly higher than the divided voltage Vdiv is input to the inverting input terminal, and until when the high voltage Vhv reaches near the target voltage, the charge pump circuit 2 is made to continuously operate without relating to the clock Cclk. Thereafter, the offset free comparator circuit 3A-1 operates in a high precision in a manner to make the high voltage Vhv to become the target voltage. During the offset cancellation period, the charge pump circuit 2 stops operating, and the high voltage Vhv is slightly decreased. As a result, similar to the embodiment 2, the comparator operation period of the clock Cclk1 has longer than the offset cancellation period.

As described above, in the present embodiment, the offset free comparator circuit 3A-1 and the differential amplifier A2 are used to make the charge pump circuit 2 to operate, so that the problem that the high voltage Vhv is increased or greatly decreased during a non-control period of the charge pump is resolved. Therefore, compared with the conventional technique, the high voltage generating circuit of the invention can stably operate, and the predetermined high voltage can be controlled in high precision.

Embodiment 4

Figure 9:
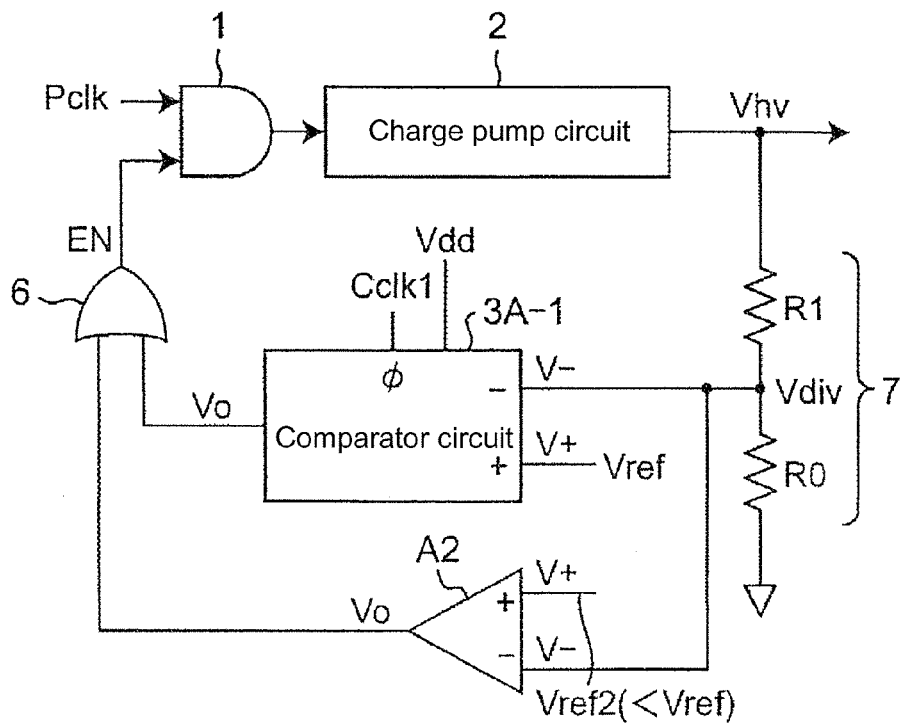
FIG. 9 is a circuit diagram of a high voltage generating circuit according to an embodiment 4 of the invention.

FIG. 9 is a circuit diagram of a high voltage generating circuit according to the embodiment 4 of the invention. As shown in FIG. 9, compared to the high voltage generating circuit of the embodiment 3 of FIG. 8, the high voltage generating circuit of the embodiment 4 has following differences:

(1) the voltage dividing circuit 7 is the same with that of the embodiment 1. The divided voltage Vdiv is input to the inverting input terminals of the comparator circuit 3A-1 and the differential amplifier A2.

(2) regarding the reference voltage input to the non-inverting input terminal of the differential amplifier A2, a reference voltage Vref2 lower than the aforementioned reference voltage Vref is used, and the reference voltage Vref2 is, for example, represented by a following equation:

$$Vref2 = Vref - \Delta Vref \quad (2)$$

Where, ΔVref=0.01V to 0.1V.

Based on the above constitution, the high voltage generating circuit has the same effects with that of the high voltage generating circuit of the embodiment 3.

Moreover, in the embodiment 3 and the embodiment 4, similar to the embodiment 2, by preparing more than two sets of the offset free comparator circuits and the corresponding charge pump circuit, and shifting each of the offset cancellation periods, the same effects with that of the embodiment 2 are achieved.

Here, the number of the differential amplifier serving as the common comparator without the offset free function can be one with common use or also plural, in case of plural, a plurality of resistors r2 are configured in the embodiment 3, and a plurality of reference voltages Vref2 are configured in the embodiment 4.

Embodiment 5

Figure 10A:
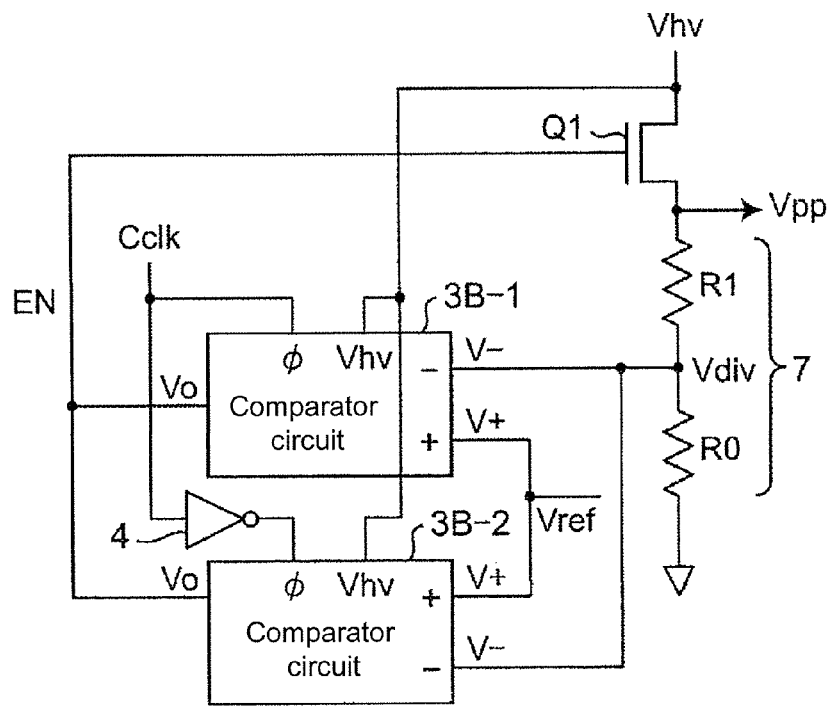
FIG. 10A is a circuit diagram of a regulator circuit according to an embodiment 5 of the invention.
Figure 10B:
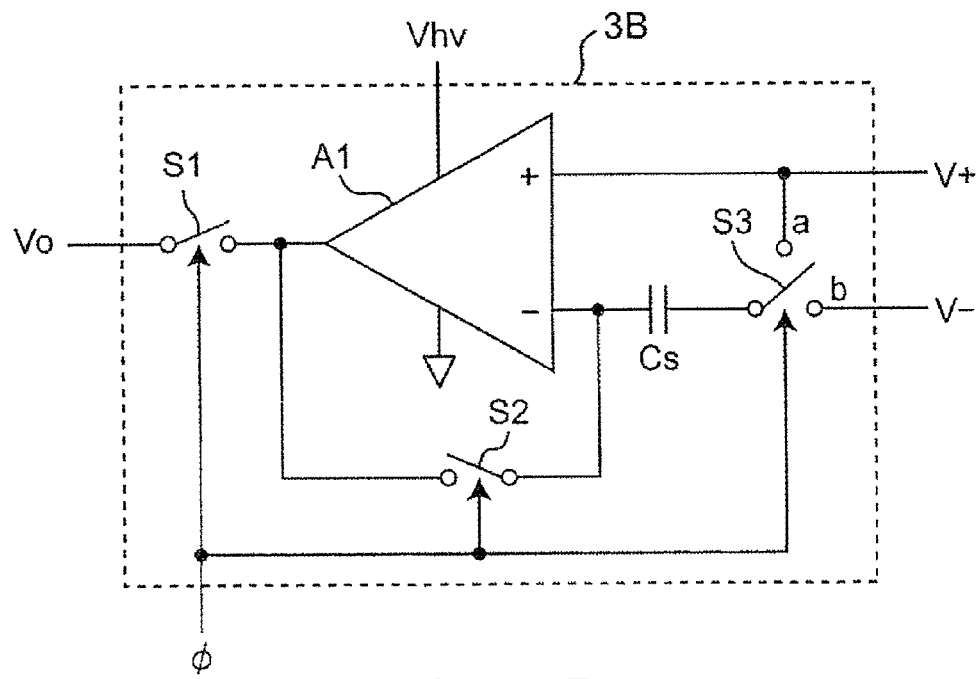
FIG. 10B is a circuit diagram of a comparator circuit 3B of FIG. 10A.

FIG. 10A is a circuit diagram of a regulator circuit according to the embodiment 5 of the invention. FIG. 10B is a circuit diagram of a comparator circuit 3B of FIG. 10A. For example, a non-volatile memory device such as a NAND flash memory, etc., uses the output voltage of the high voltage generating circuit including the aforementioned charge pump circuit, and a voltage regulator circuit is used to generate various voltages from the high voltage (HV) to a middle voltage (MV). In the following embodiment, the regulator circuit adapted to each of the above voltages is described below.

In FIG. 10A, the regulator circuit of the embodiment 5 includes a comparator circuit 3B-1, a comparator circuit 3B-2 (referred to as a comparator circuit 3B in general), an inverter 4, a voltage dividing resistor R0, a voltage dividing resistor R1 and a N-channel MOS transistor Q1 constructing a step down circuit, where the step down circuit decreases the input high voltage Vhv to a output voltage Vpp.

The high voltage Vhv is exerted to a drain of the MOS transistor Q1, and is exerted to a power terminal of each of the comparator circuit 3B-1 and the comparator circuit 3B-2. The clock Cclk is provided to the comparator circuit 3B-1, and the clock Cclk is provided to the comparator circuit 3B-2 through the inverter 4. The divided voltage Vdiv come from the voltage dividing circuit 7 is input to an inverting input terminal of each of the comparator circuit 3B-1 and the comparator circuit 3B-2. The predetermined reference voltage Vref is input to a non-inverting input terminal of each of the comparator circuit 3B-1 and the comparator circuit 3B-2. The output voltages Vo come from the comparator circuit 3B-1 and the comparator circuit 3B-2 are taken as the enable signal EN for exerting to a gate of the MOS transistor Q1. Moreover, a source of the MOS transistor Q1 generates the predetermined output voltage Vpp obtained by decreasing the high voltage Vhv for outputting.

In FIG. 10B, a structure of the comparator circuit 3B is the same with that of the comparator circuit 3 of FIG. 6B, though a difference there between is that the high voltage Vhv is exerted to the power terminal. Although not shown, other power supply voltage Vdd can also be included.

The regulator circuit includes the MOS transistor Q1, the voltage dividing circuit 7 and the comparator circuit 3B-1 and the comparator circuit 3B-2 with the reference voltage Vref, and the offset problem is that same with that of the aforementioned embodiment. Except for including the MOS transistor Q1 used for decreasing voltage, the operation of the regulator circuit is the same with that of the high voltage generating circuit of the embodiment 1. Therefore, similar to the embodiment 1, the regulator circuit can stably generate the predetermined output voltage Vpp in high precision.

Embodiment 6

Figure 11A:
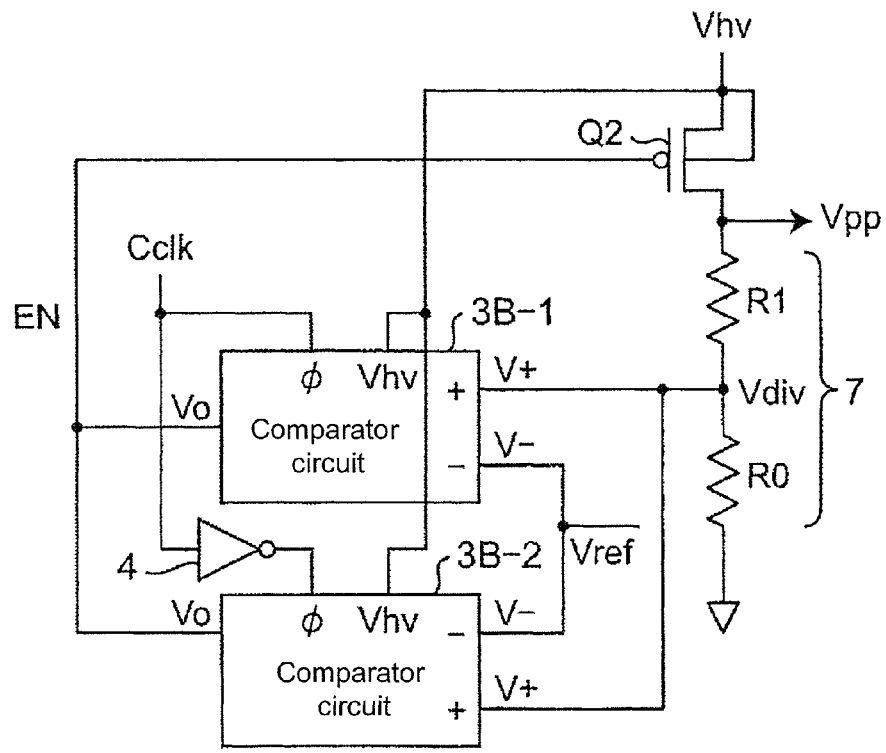
FIG. 11A is a circuit diagram of a regulator circuit according to an embodiment 6 of the invention.

FIG. 11A is a circuit diagram of a regulator circuit according to the embodiment 6 of the invention. As shown in FIG. 11A, compared to the regulator circuit of the embodiment 5 of FIG. 10A, the regulator circuit of the embodiment 6 has following differences:

(1) includes a P-channel MOS transistor Q2 constructing a step down circuit to replace the N-channel MOS transistor Q1. Moreover, a substrate tap of the P-channel MOS transistor Q2 is connected to the high voltage Vhv.

(2) input voltages input to the comparator circuit 3B-1 and the comparator 3B-2 are different. To be specific, the divided voltage Vdiv come from the voltage dividing circuit 7 is input to the non-inverting input terminals of the comparator circuit 3B-1 and the comparator circuit 3B-2, and the predetermined reference voltage Vref is input to the inverting input terminals of the comparator circuit 3B-1 and the comparator circuit 3B-2.

In the aforementioned regulator circuit, besides the MOS transistor Q2 is implemented by the P-channel MOS transistor, the operation of the regulator circuit is the same with that of the regulator circuit of the embodiment 5. Therefore, similar to the embodiment 5, the regulator circuit can stably generate the predetermined output voltage Vpp in high precision.

Variation of the Embodiment 6

Figure 11B:
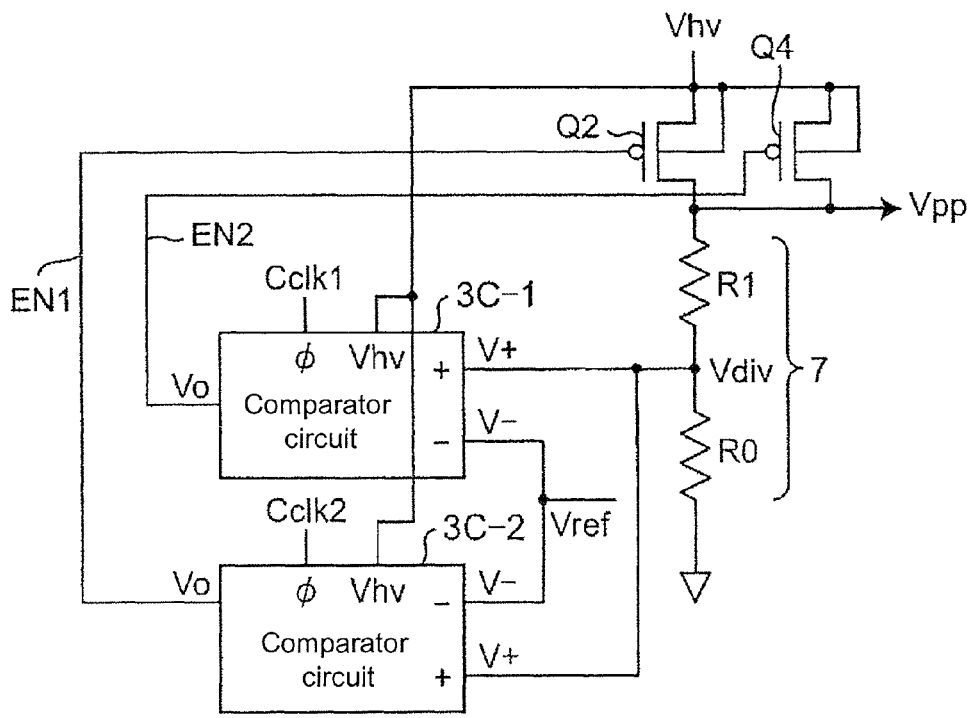
FIG. 11B is a circuit diagram illustrating a variation of the regulator circuit of the embodiment 6.

FIG. 11B is a circuit diagram illustrating a variation of the regulator circuit of the embodiment 6, which is a circuit obtained after modifying the circuit of the embodiment 6 of FIG. 11A according to a same manner of modifying the embodiment 1 into the embodiment 2, and compared to the regulator circuit of FIG. 11A, the regulator circuit of FIG. 11B has following differences:

(1) further includes a P-channel MOS transistor Q4. Moreover, a substrate tap of the P-channel MOS transistor Q4 is connected to the high voltage Vhv.

(2) includes a comparator circuit 3C to replace the comparator circuit 3B. A structure of the comparator circuit 3C is the same with that of the comparator circuit 3A, and the difference there between is that the high voltage Vhv is exerted to the power terminal thereof. Although not shown, the other power supply voltage Vdd can also be included. The outputs of each of the comparator circuits are respectively connected to gates of the P-channel MOS transistor Q2 and the P-channel MOS transistor Q4.

(3) includes two clocks Cclk1 and Cclk2, which is the same to the embodiment 2.

Similar to the embodiment 2, in the regulators of the embodiment 6 and the variation thereof, the offset cancellation periods of two clocks are shifted, so as to achieve the same effects with that of the embodiment 2. Similar to the embodiment 5, the predetermined output voltage Vpp can be stably generated in high precision, and the ripple voltage is decreased.

Embodiment 7

Figure 12:
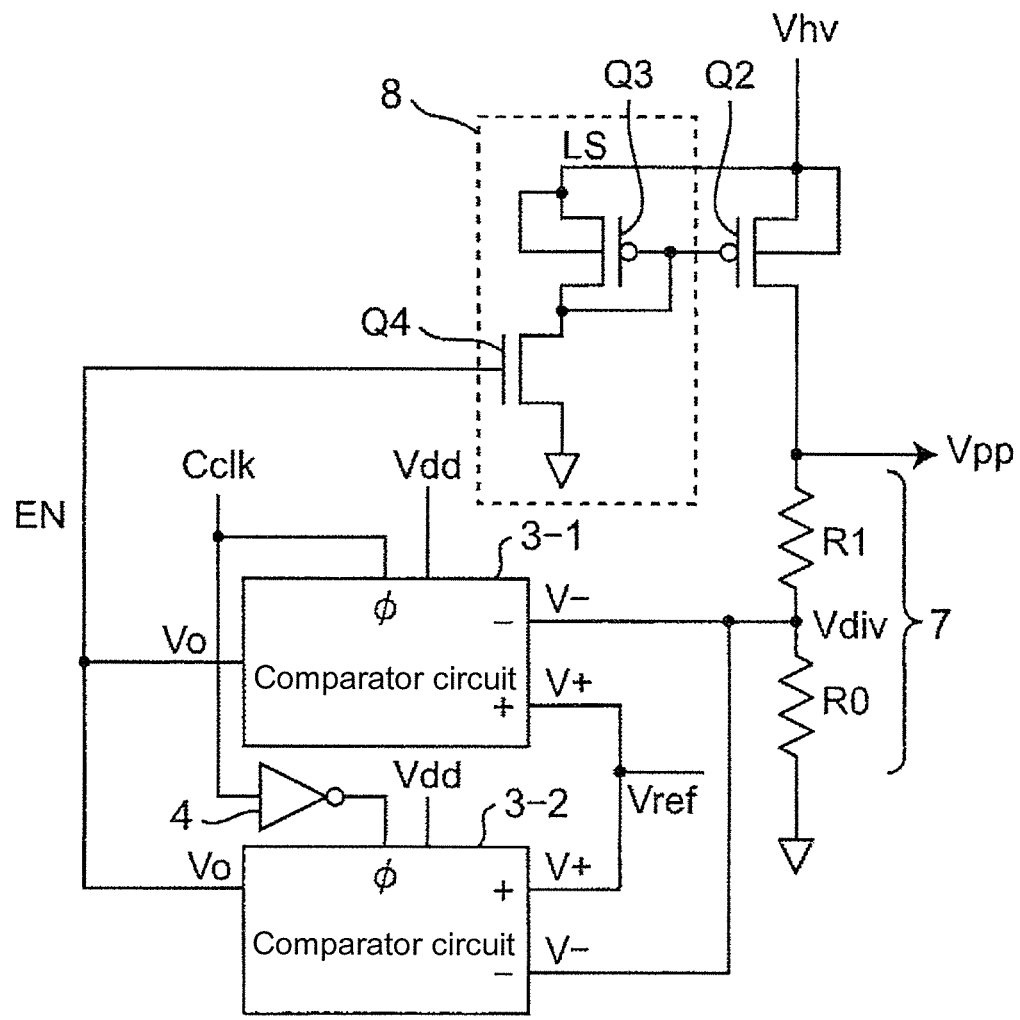
FIG. 12 is a circuit diagram of a regulator circuit according to an embodiment 7 of the invention.

FIG. 12 is a circuit diagram of a regulator circuit according to the embodiment 7 of the invention. As shown in FIG. 12, compared to the regulator circuit of the embodiment 6 of FIG. 11A, the regulator circuit of the embodiment 7 has following differences:

(1) includes a P-channel MOS transistor Q3 and an N-channel MOS transistor Q4, and further includes a level shifter 8, where the level shifter 8 shifts (boosts) a level of the enable signal EN and exerts the same to the MOS transistor Q2.

(2) includes a comparator circuit 3-1 and a comparator circuit 3-2 to replace the comparator circuit 3B-1 and the comparator circuit 3B-2, and the input power supply voltage and the input voltages are different. To be specific, the power supply voltage is changed to the power supply voltage Vdd, and the divided voltage Vdiv come from the voltage dividing circuit 7 is input to inverting input terminals of the comparator circuit 3-1 and the comparator circuit 3-2, and the predetermined reference voltage Vref is input to non-inverting input terminals of the comparator circuit 3-1 and the comparator circuit 3-2.

In this way, the MOS transistors Q2 to Q4 construct a step down circuit. The aforementioned differences are described in detail below.

In the level shifter 8 of FIG. 12, the enable signal EN is exerted to a gate of the MOS transistor Q4, and a source of the MOS transistor Q4 is connected to the ground. A drain of the MOS transistor Q4 is connected to a drain and a gate of the MOS transistor Q3 and a gate of the MOS transistor Q2. The high voltage Vhv is exerted to a source and a substrate tap of the MOS transistor Q2 and a substrate tap and a source of the MOS transistor Q3, and a drain of the MOS transistor Q2 is connected to the voltage dividing circuit 7, and outputs the output voltage Vpp.

In the aforementioned regulator circuit, the comparator circuit 3-1 and the comparator circuit 3-2 operate under the predetermined power voltage Vdd, and the level shifter 8 constructs a level shift and logic consistent circuit. In order to avoid oscillation, sizes of the MOS transistors Q2 to Q4 are required to be carefully set. Moreover, the gate of the MOS transistor Q2 may be connected to a circuit including capacitor and resistor in series (another end thereof is connected to the ground) to prevent the oscillation.

In the aforementioned regulator circuit, besides that the level shifter 8 is used, the operation of the aforementioned regulator circuit is the same with that of the regulator circuits of the embodiment 5 and the embodiment 6. Therefore, similar to the embodiment 5 and the embodiment 6, the regulator circuit can stably generate the predetermined output voltage Vpp in high precision.

Embodiment 8

Figure 13:
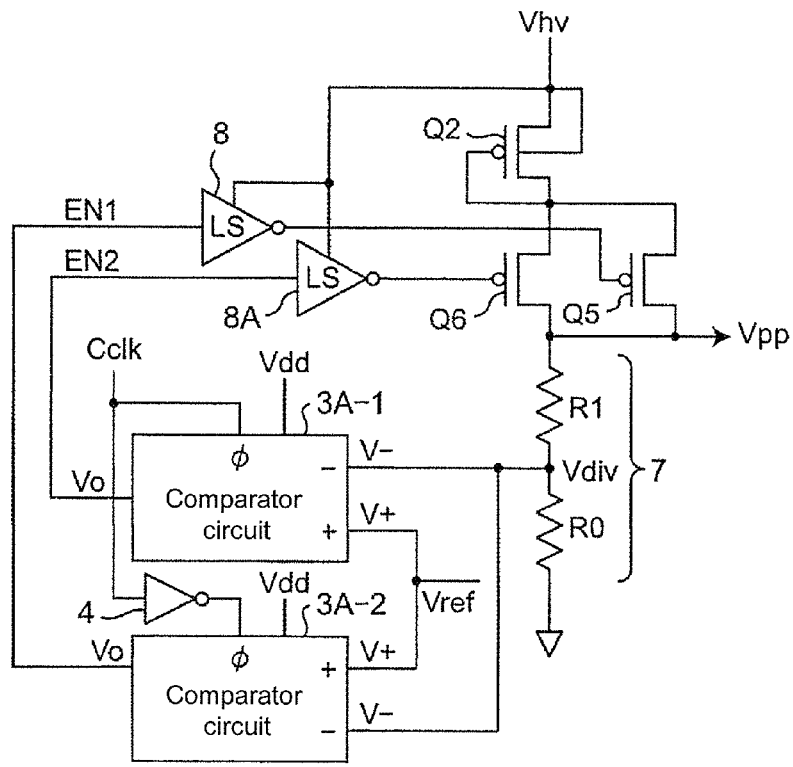
FIG. 13 is a circuit diagram of a regulator circuit according to an embodiment 8 of the invention.

FIG. 13 is a circuit diagram of a regulator circuit according to the embodiment 8 of the invention. As shown in FIG. 13, compared to the regulator circuit of the embodiment 7 of FIG. 12, the regulator circuit of the embodiment 8 has following differences:

(1) besides the level shifter 8, further includes a level shifter 8A for level shifting (boost).

(2) further includes a P-channel MOS transistor Q5 used for the level shifter 8 and a P-channel MOS transistor Q6 used for the level shifter 8A. The MOS transistor Q5 and the MOS transistor Q6 are connected in series with the MOS transistor Q2 between the input voltage and the output voltage, and the MOS transistor Q5 and the MOS transistor Q6 are connected in parallel to each other. Moreover, the level shifter 8 and the level shifter 8A are driven by the high voltage Vhv.

(3) includes a comparator circuit 3A-1 and a comparator circuit 3A-2 to replace the comparator circuit 3-1 and the comparator circuit 3-2.

In FIG. 13, the high voltage Vhv is exerted to a source and a substrate tap of the MOS transistor Q2, and a gate of the MOS transistor Q2 is connected to sources of the MOS transistor Q5 and the MOS transistor Q6. The comparator circuit 3A-2 outputs an output voltage serving as a comparison result, where the output voltage is taken as the enable signal EN1 and input to the gate of the MOS transistor Q5 through the level shifter 8. And, the comparator circuit 3A-1 outputs an output voltage serving as a comparison result, where the output voltage is taken as the enable signal EN2 and input to the gate of the MOS transistor Q6 through the level shifter 8A. Drains of the MOS transistor Q5 and the MOS transistor Q6 are connected to the voltage dividing circuit 7, and generate the predetermined output voltage Vpp for outputting.

In the aforementioned regulator circuit, the comparator circuit 3A-1 and the comparator circuit 3A-2 operate under the predetermined power supply voltage Vdd, and the level shifter 8 constructs a level shift and logic consistent circuit. In order to avoid oscillation, sizes of the MOS transistors Q2 to Q6 are required to be carefully set. Particularly, the MOS transistor Q2 is added in order to avoid oscillation.

Similar to the embodiment 2, the embodiment 8 may includes more than two sets of the comparator circuits, the level shift circuits, the PMOS transistors and the slightly shifted clocks during the offset cancellation period, so as to achieve the same effects as that of the embodiment 2.

In the aforementioned regulator circuit, besides that the level shifter 8 is used, the operation of the aforementioned regulator circuit is the same with that of the regulator circuits of the embodiment 5 and the embodiment 6. Therefore, similar to the embodiment 5 and the embodiment 6, the regulator circuit can stably generate the predetermined output voltage Vpp in high precision.

Embodiment 9

Figure 14A:
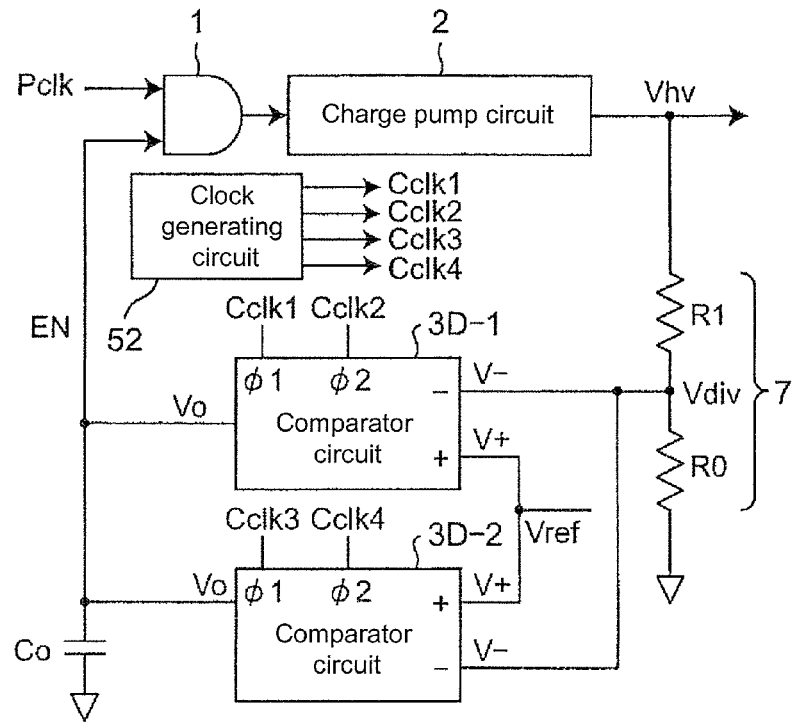
FIG. 14A is a circuit diagram of a high voltage generating circuit according to an embodiment 9 of the invention.
Figure 14B:
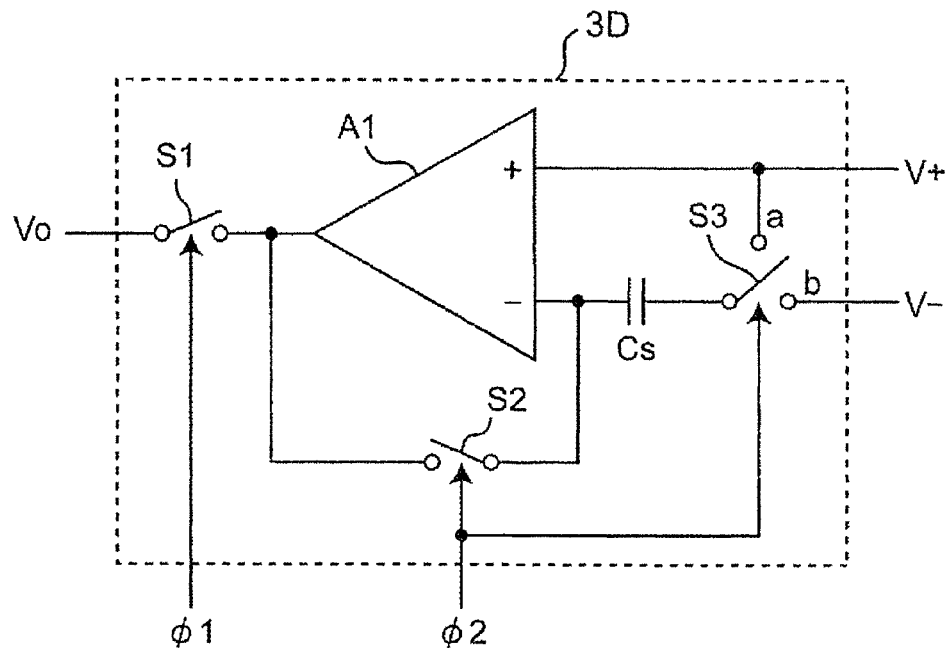
FIG. 14B is a circuit diagram of a comparator circuit 3D of FIG. 14A.
Figure 14C:
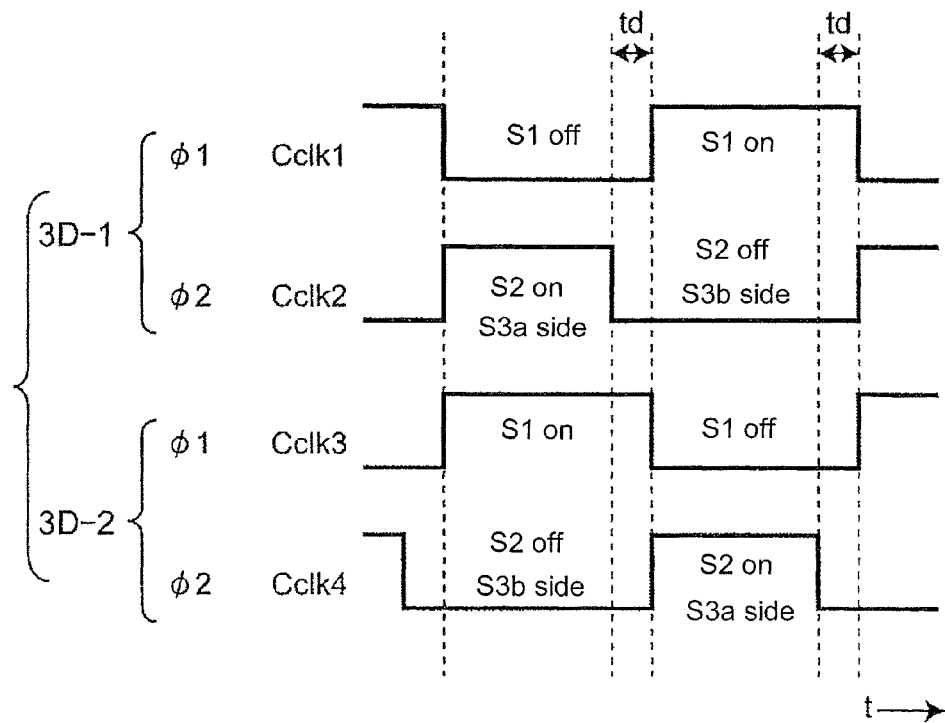
FIG. 14C is a timing diagram of clocks Cclk1 to Cclk4 generated by a clock generating circuit 51 of FIG. 14A.

FIG. 14A is a circuit diagram of a high voltage generating circuit according to the embodiment 9 of the invention, and FIG. 14B is a circuit diagram of a comparator circuit 3D of FIG. 14A. Moreover, FIG. 14C is a timing diagram of clocks Cclk1 to Cclk4 generated by a clock generating circuit 52 of FIG. 14A, and is a diagram illustrating connection of switches of a comparator circuit 3D-1 and a comparator circuit 3D-2.

As shown in FIG. 14A, compared to the high voltage generating circuit of the embodiment 1 of FIG. 6A, the high voltage generating circuit of the embodiment 9 has following differences:

(1) includes the comparator circuit 3D-1 and the comparator circuit 3D-2 (referred to as a comparator circuit 3D in general) to replace the comparator circuit 3-1 and the comparator circuit 3-2.

(2) further includes a capacitor Co at an output terminal of the comparator circuit 3D.

(3) includes the clock generating circuit 52 to replace the clock generating circuit 50. Correspondingly, the inverter 4 is removed.

Details of the above differences are described below.

Referring to FIG. 14A and FIG. 14C, the clock generating circuit 52 controls a switch S1, a switch S2 and a switch S3 of each of the comparator circuits through a clock Cclk1, a clock Cclk2, or a clock Cclk3 and a clock Cclk4. A purpose thereof is that at the moment that the offset cancellation period is changed to the comparator operation period, a certain time period is required before the comparator circuit outputs the accurate comparison result. Therefore, it's necessary such transition period is not used for controlling the charge pump. In FIG. 14C, a time period represented by a period td is the time period required by the aforementioned transition.

The comparator circuit 3D-1 outputs the output voltage Vo of the comparison result synchronously with the clock Cclk1 and the clock Cclk2, and the output voltage Vo is taken as the enable signal EN and is input to the second input terminal of the AND gate 1, where the clock Cclk1 controls the switch S1, and the clock Cclk2 controls the switch S2 and the switch S3. Started from a moment that the switch S2 and the switch S3 are switched from an offset cancellation setting to a comparator operation setting, after the time period td, the switch S1 is turned on to output the output voltage Vo to serve as the enable signal EN. In this way, although the transition period of the comparison operation of the comparator circuit 3D-1 is not reflected to the enable signal EN, the time period td is still controlled by the comparator circuit 3D-2. Therefore, similar to the embodiment 1, the charge pump is seamlessly controlled. The comparator circuit 3D-2 is also operated like the above under control of the clock Cclk3 and the clock Cclk4. The clock Cclk3 is an inverted clock of the clock Cclk1, and the clock Cclk4 is a clock obtained by shifting the clock Cclk2 by a half cycle of the clock Cclk1, so as to achieve the aforementioned operation.

Therefore, according to such timing control, the transition period problem of a response speed of the comparator circuit when the comparator comparison operation is started is avoided, so as to control the charge pump in high precision.

Moreover, although the transition period problem of the response speed of the comparator circuit when the comparator comparison operation is started is common in all of the embodiments, it can be resolved by suitably controlling the switches of the comparator circuit as that does in the embodiment 9. Moreover, the capacitor Co is used for decreasing the noise generated when the comparator circuit is switched and adjusting the response speed.

Effects of the Embodiments

Figure 15A:
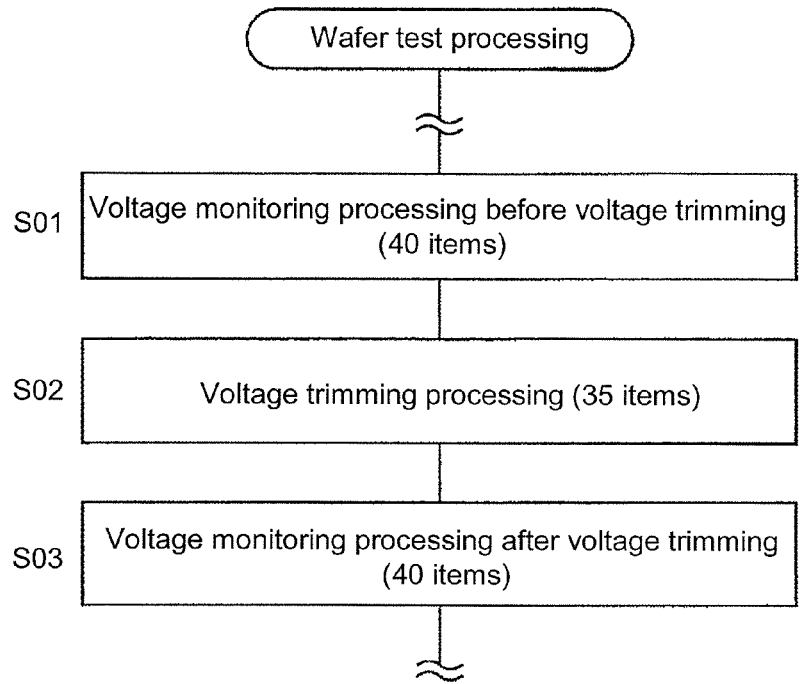
FIG. 15A is a flowchart of an example of wafer test processing of a conventional flash memory.
Figure 15B:
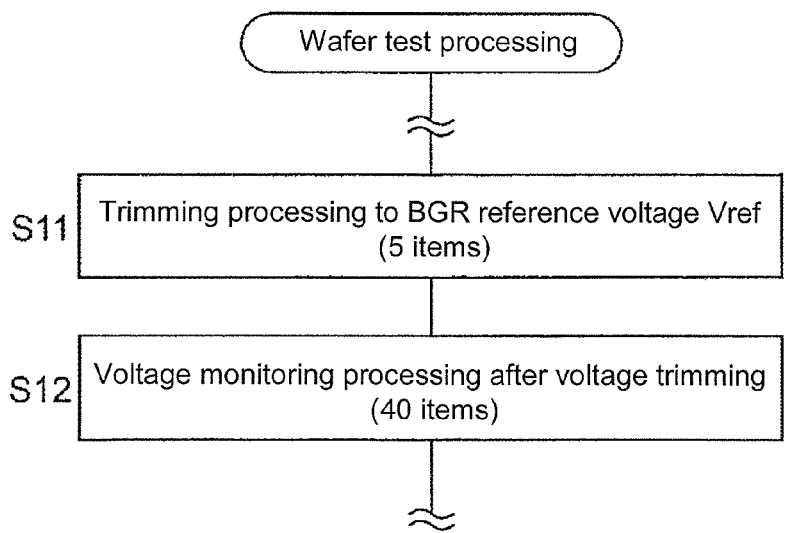
FIG. 15B is a flowchart of an example of wafer test processing of a flash memory of the invention.

FIG. 15A is a flowchart of an example of wafer test processing of a conventional flash memory. FIG. 15B is a flowchart of an example of wafer test processing of the flash memory using the high voltage generating circuit and the regulator circuit of the invention.

In step S01 of FIG. 15A, a voltage monitoring processing is executed before voltage trimming (adjusting), and in step S02, a trimming processing is performed to the various voltages. Then, in step S03, the voltages are monitors after the voltage trimming. The various voltages of the step S02 are, for example, as follows:

(1) the reference voltage Vref used for the high voltage (HV), the middle voltage (MV) and the low voltage (LV), the reference voltage Vref used for an oscillation circuit and the reference voltage Vref used for a standby circuit;

(2) the high voltage (HV) used for programming (data writing) and data erasing;

(3) the middle voltage (MV) used for programming (data writing), data erasing and data reading; and (4) the low voltage (LV) supplying levels of a plurality of control signals.

Accordingly, in FIG. 15B, in case that the high voltage generating circuit and the regulator circuit of the invention are applied to a non-volatile memory device such as a flash memory, the process become simple as following. In a step S11 of FIG. 15B, after the processing of trimming a reference voltage Vrefw of band gap reference (BGR), in step S12, the voltage monitoring processing is executed after the voltage trimming.

In case that the high voltage generating circuit and the regulator circuit of the invention are applied to a non-volatile memory device such as a flash memory, the high voltage Vhv come from the high voltage generating circuit including the charge pump circuit can be accurately control in high precision without executing the processing of trimming the various voltages. In this way, not only the related circuit is removed from the manufactured semiconductor chip, but also an operation time and a test time of the wafer test can be greatly decreased. In the wafer test of the conventional example of FIG. 15A, processing of totally 115 items is required. Comparatively, by using the circuits of the invention, more than a half of the above items are decreased to remain about 45 items, by which the manufacturing cost is decreased and the size of the semiconductor chip is greatly decreased.

Variation

In the aforementioned embodiments, the high voltage generating circuit is described, though the invention is not limited thereto, and a voltage generating circuit at least generating a voltage higher than the reference voltage Vref can also be adopted.

The high voltage generating circuit of the invention is not limited to be applied to the NAND flash memory, and can be also applied to the non-volatile semiconductor memory device of other type of flash memory, for example, applied to a regulator circuit of an electronic device, and a semiconductor device of a power device, etc.

In case that the CMOS circuit is used for fabricating the circuits of the invention, the switch devices are composed of MOS transistors, and the capacitors are composed of MOS capacitors or MOM (using inter-wiring capacitor) capacitors, MIS (using an insulation film formed between inter-wiring layers) capacitors, the resistor is composed of a diffusion layer or a polysilicon layer. Moreover, besides using resistors for dividing voltage, the voltage dividing circuit can also use a capacitor voltage dividing circuit that connects the capacitors in series.

As described above, compared with that of the conventional technique, the voltage generating circuit and the regulator circuit of the invention can stably operate, and can control the predetermined high voltage in high precision.

What is claimed is:

1. A voltage generating circuit, comprising: a charge pump circuit raising a voltage to a high voltage higher than a power supply voltage, an output voltage control circuit controlling the voltage to make the raised high voltage to be a predetermined target voltage, and a voltage dividing circuit dividing the high voltage into a corresponding divided voltage, and outputs the divided voltage to the output voltage control circuit, and the voltage generating circuit being characterized in that:
the output voltage control circuit comprises at least two offset free comparator circuits,
wherein each of the offset free comparator circuits comprises:
an input terminal;
a first output terminal;
a coupling capacitor, receiving the divided voltage through the input terminal;
a first differential amplifier, comprising an inverted input terminal, a non-inverted input terminal, and a second output terminal, the first differential amplifier comparing a voltage received from the coupling capacitor through the inverted input terminal with a predetermined reference voltage received through the non-inverted input terminal, and outputting a comparison result voltage to the charge pump circuit through the second output terminal and the first output terminal;
a first switch, switching to connect the second output terminal of the first differential amplifier to the first output terminal during a comparator operation period, and switching to connect the first output terminal to a ground level during an offset cancellation period;
a second switch, coupled between the inverted input terminal of the first differential amplifier and the second output terminal, wherein the second switch is turned off during the comparator operation period and is turned on during the offset cancellation period; and
a third switch, switching to connect the input terminal of the offset free comparator circuit to the inverted input terminal of the first differential amplifier through the coupling capacitor during the comparator operation period, and switching to connect the inverted input terminal of the first differential amplifier to the non-inverted input terminal of the first differential amplifier through the coupling capacitor during the offset cancellation period,
wherein the at least two offset free comparator circuits use at least two clocks, the offset cancellation periods are not overlapped to each other, the comparator operation periods are overlapped to each other, the comparator operation periods are longer than the offset cancellation periods, and in each of the offset free comparator circuits, the offset cancellation period and the comparator operation period alternately function.

2. A voltage generating circuit, comprising: a charge pump circuit raising a voltage to a high voltage higher than a power supply voltage and an output voltage control circuit controlling the voltage to make the raised high voltage to be a predetermined target voltage, and a voltage dividing circuit dividing the high voltage into a corresponding divided voltage, and outputs the divided voltage to the output voltage control circuit, and the voltage generating circuit being characterized in that:
the output voltage control circuit comprises an offset free comparator circuit and a first differential amplifier,
wherein the offset free comparator circuit comprises:
an input terminal;
a first output terminal;
a coupling capacitor, receiving the divided voltage through the input terminal;
a second differential amplifier, comprising an inverted input terminal, a non-inverted input terminal, and a second output terminal, the second differential amplifier comparing a voltage received from the coupling capacitor through the inverted input terminal with a predetermined reference voltage received through the non-inverted input terminal, and outputting a comparison result voltage to the charge pump circuit through the second output terminal and the first output terminal;
a first switch, coupled between the second output terminal of the second differential amplifier and the first output terminal, wherein the first switch is turned on during a comparator operation period and is turned off during an offset cancellation period;

a second switch, coupled between the inverted input terminal of the second differential amplifier and the second output terminal, wherein the second switch is turned off during the comparator operation period and is turned on during the offset cancellation period; and a third switch, switching to connect the input terminal of the offset free comparator circuit to the inverted input terminal of the second differential amplifier through the coupling capacitor during the comparator operation period, and switching to connect the inverted input terminal of the second differential amplifier to the non-inverted input terminal of the second differential amplifier through the coupling capacitor during the offset cancellation period, wherein the first differential amplifier compares a voltage received from the input terminal with an another reference voltage less than the reference voltage, or compares a voltage higher than the voltage received from the input terminal with the reference voltage, and outputting a comparison result to the charge pump circuit, wherein the offset free comparator circuit uses at least one clock, the comparator operation period is longer than the offset cancellation period, and the offset cancellation period and the comparator operation period alternately function.

3. The voltage generating circuit as claimed in claim 2, wherein the voltage dividing circuit divides the high voltage into a first divided voltage and a second divided voltage, wherein the second divided voltage is lower than the first divided voltage, and the voltage dividing circuit outputs the first divided voltage to the first differential amplifier, and outputs the second divided voltage to the offset free comparator circuit.

4. The voltage generating circuit as claimed in claim 2, wherein the voltage dividing circuit outputs the divided voltage to the offset free comparator circuit and the first differential amplifier,
and the reference voltage input to the offset free comparator circuit is higher than the reference voltage input to the first differential amplifier.

5. The voltage generating circuit as claimed in claim 2, wherein the output voltage control circuit comprises at least two offset free comparator circuits and at least one differential amplifier,
the at least two offset free comparator circuits use at least two clocks, and offset cancellation periods are not overlapped to each other, and in each of the offset free comparator circuits, the offset cancellation period and a comparator operation period alternately function.

6. The voltage generating circuit as claimed in claim 5, wherein the voltage dividing circuit divides the high voltage into a first divided voltage and a second divided voltage, wherein the second divided voltage is lower than the first divided voltage, and the voltage dividing circuit outputs the first divided voltage to the differential amplifier, and outputs the second divided voltage to the offset free comparator circuit.

7. The voltage generating circuit as claimed in claim 5, wherein the voltage dividing circuit outputs the divided voltage to the offset free comparator circuit and the differential amplifier,
and the reference voltage input to the offset free comparator circuit is higher than the reference voltage input to the differential amplifier.

8. A regulator circuit, comprising:
a step down circuit, decreasing an input voltage to an output voltage;
an output voltage control circuit, controlling the output voltage to be a predetermined target voltage; and
a voltage dividing circuit, dividing the output voltage into a corresponding divided voltage, and outputting the divided voltage to the output voltage control circuit,
the regulator circuit is characterized in that:
the output voltage control circuit includes at least two offset free comparator circuits,
wherein each of the offset free comparator circuits comprises:
an input terminal;
a first output terminal;
a coupling capacitor, receiving the divided voltage through the input terminal;
a first differential amplifier, comprising an inverted input terminal, a non-inverted input terminal, and a second output terminal, the first differential amplifier comparing a voltage received from the coupling capacitor through the inverted input terminal with a predetermined reference voltage received through the non-inverted input terminal, and outputting a comparison result voltage to the step down circuit through the second output terminal and the first output terminal;
a first switch, coupled between the second output terminal of the first differential amplifier and the first output terminal, wherein the first switch is turned on during a comparator operation period and is turned off during an offset cancellation period;
a second switch, coupled between the inverted input terminal of the first differential amplifier and the second output terminal, wherein the second switch is turned off during the comparator operation period and is turned on during offset the cancellation period; and
a third switch, switching to connect the input terminal of the offset free comparator circuit to the inverted input terminal of the first differential amplifier through the coupling capacitor during the comparator operation period, and switching to connect the inverted input terminal of the first differential amplifier to the non-inverted input ten al of the first differential amplifier through the coupling capacitor during the offset cancellation period,
wherein the at least two offset free comparator circuits use at least two clocks, and the offset cancellation periods are not overlapped to each other, the comparator operation periods are overlapped to each other, the comparator operation periods are longer than the cancellation periods, and in each of the offset free comparator circuits, the offset cancellation period and the comparator operation period alternately function,
wherein the step down circuit comprises at least one first metal oxide semiconductor transistor, the first metal oxide semiconductor transistor is a N-channel metal oxide semiconductor transistor or a P-channel metal oxide semiconductor transistor.

9. The regulator circuit as claimed in claim 8, further comprising:
at least one second metal oxide semiconductor transistors, respectively connected to the first metal oxide semiconductor transistor in series between the input voltage and the output voltage, wherein the at least two first metal oxide semiconductor transistors are connected to each other in parallel; and a plurality of level shifters, performing voltage conversion of each of the comparison result voltages come from the at least two offset free comparator circuits, and respectively exerting each voltage-converted voltage to gates of the at least two first metal oxide semiconductor transistors.

* * * * *